(12) United States Patent
Yu et al.

(10) Patent No.: US 11,251,091 B2
(45) Date of Patent: Feb. 15, 2022

(54) SEMICONDUCTOR DEVICE WITH CONTRACTED ISOLATION FEATURE

(71) Applicant: TAIWAN SEMICONDUCTOR MANUFACTURING CO., LTD., Hsinchu (TW)

(72) Inventors: Dian-Sheg Yu, Hsinchu (TW); Ren-Fen Tsui, Hsinchu (TW); Jhon-Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/074,306

(22) Filed: Oct. 19, 2020

(65) Prior Publication Data

US 2021/0050269 A1  Feb. 18, 2021

Related U.S. Application Data

(60) Continuation of application No. 16/532,067, filed on Aug. 5, 2019, now Pat. No. 10,811,321, which is a
(Continued)

(51) Int. Cl.
*H01L 21/8238* (2006.01)
*H01L 27/092* (2006.01)
(Continued)

(52) U.S. Cl.
CPC ........... *H01L 21/823821* (2013.01); *H01L 21/28114* (2013.01); *H01L 21/3105* (2013.01); *H01L 21/823431* (2013.01); *H01L 21/823481* (2013.01); *H01L 27/0924* (2013.01); *H01L 27/1104* (2013.01); *H01L 29/42376* (2013.01); *H01L 29/66545* (2013.01); *H01L 29/7843* (2013.01); *H01L 21/823437* (2013.01); *H01L 21/823814* (2013.01);
(Continued)

(58) Field of Classification Search
CPC ..... H01L 21/823807; H01L 21/823821; H01L 21/823878; H01L 21/823814; H01L 29/66545; H01L 21/28114; H01L 21/3105; H01L 21/823431; H01L 21/823481; H01L 27/0924; H01L 27/1104; H01L 29/42376; H01L 29/7843; H01L 21/823437; H01L 21/823828; H01L 27/0207; H01L 29/7848
USPC .......................... 257/369, 367, 389, E21.444
See application file for complete search history.

(56) References Cited

U.S. PATENT DOCUMENTS 8,836,016 B2  9/2014 Wu et al.
8,841,701 B2  9/2014 Lin et al.
(Continued)

*Primary Examiner* — Bo B Jang
(74) *Attorney, Agent, or Firm* — Maschoff Brennan

(57) ABSTRACT

A semiconductor device includes a semiconductor fin, a gate cut region, a first gate structure and a second gate structure. The semiconductor fin extends from a substrate. The gate cut region extends in parallel with a longitudinal axis of the semiconductor fin and not overlaps the semiconductor fin. The first gate structure and the second gate structure extend across the semiconductor fin. The first gate structure is laterally between the gate cut region and the second gate structure along a direction parallel with the longitudinal axis of the semiconductor fin. The first gate structure has a greater width variation than the second gate structure.

20 Claims, 20 Drawing Sheets

Related U.S. Application Data division of application No. 15/600,919, filed on May 22, 2017, now Pat. No. 10,373,879.

(60) Provisional application No. 62/490,591, filed on Apr. 26, 2017.

(51) Int. Cl.

| | |
|---|---|
| *H01L 27/11* | (2006.01) |
| *H01L 29/66* | (2006.01) |
| *H01L 21/3105* | (2006.01) |
| *H01L 21/8234* | (2006.01) |
| *H01L 21/28* | (2006.01) |
| *H01L 29/423* | (2006.01) |
| *H01L 29/78* | (2006.01) |
| *H01L 27/02* | (2006.01) |

(52) U.S. Cl.
CPC ............ *H01L 21/823828* (2013.01); *H01L 21/823878* (2013.01); *H01L 27/0207* (2013.01); *H01L 29/7848* (2013.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2014/0151812 A1* | 6/2014 | Liaw ............ H01L 21/76816 257/368 |
| 2014/0346607 A1 | 11/2014 | Ching et al. |
| 2014/0349473 A1 | 11/2014 | Lin et al. |
| 2015/0187939 A1 | 7/2015 | Wu et al. |
| 2016/0056157 A1 | 2/2016 | Ching et al. |
| 2016/0379839 A1 | 12/2016 | Hsu et al. |
| 2019/0164741 A1* | 5/2019 | Wen ............ H01L 21/0214 |
| 2021/0098049 A1* | 4/2021 | Yang ............ H01L 27/1104 |
| 2021/0098471 A1* | 4/2021 | Chen ............ H01L 21/823431 |

\* cited by examiner

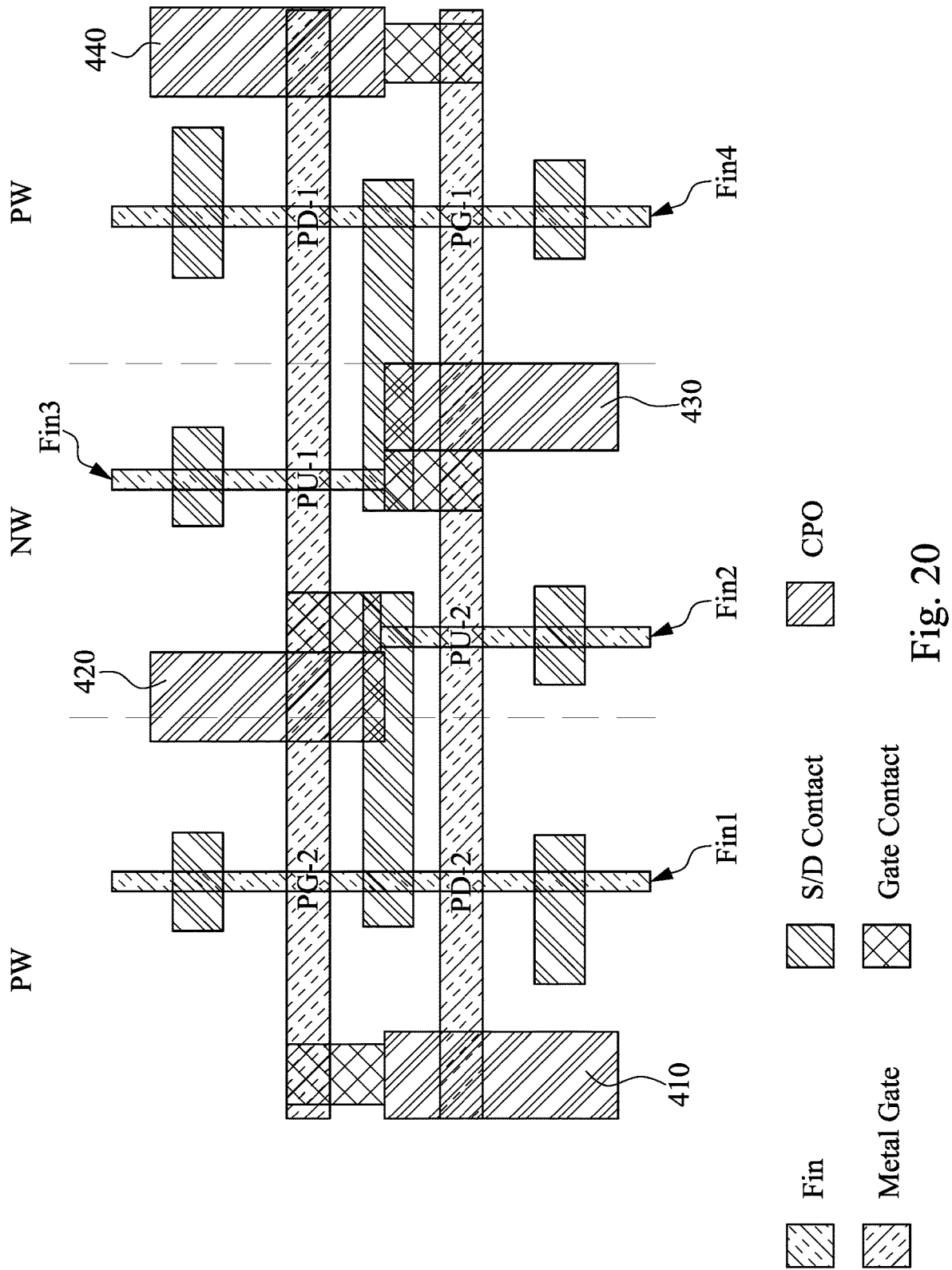

SEMICONDUCTOR DEVICE WITH CONTRACTED ISOLATION FEATURE

PRIORITY CLAIM AND CROSS-REFERENCE

This application is a continuation application of U.S. patent application Ser. No. 16/532,067, filed Aug. 5, 2019, now U.S. Pat. No. 10,811,321, issued Oct. 20, 2020, which is a divisional application of U.S. patent application Ser. No. 15/600,919, filed May 22, 2017, now U.S. Pat. No. 10,373, 879, issued Aug. 6, 2019, which claims priority to U.S. Provisional Patent Application Ser. No. 62/490,591, filed Apr. 26, 2017, the entire disclosure of each of which is incorporated herein by reference.

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' formed in a free standing manner over a major surface of a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 depicts a layout of an SRAM cell in accordance with some embodiments of the present disclosure.

DETAILED DESCRIPTION

Figure 1:
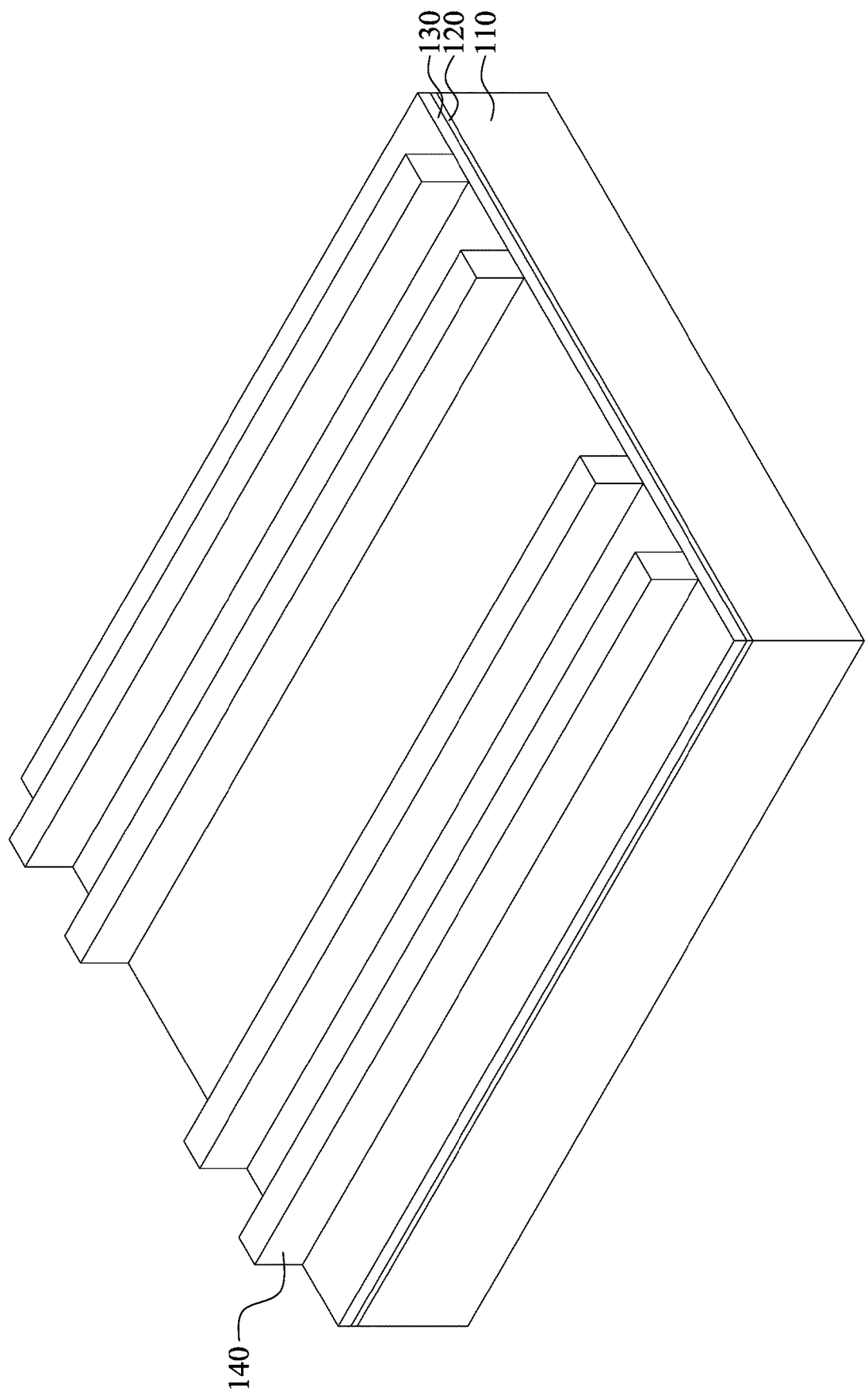
FIG. 1 to FIG. 18 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 18 illustrate a method for manufacturing a semiconductor device at various stages in accordance with some embodiments of the present disclosure. Reference is made to FIG. 1. A substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 120 and a mask layer 130 are formed on the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photo-sensitive layer 140 is formed on the mask layer 130 and is then patterned, forming openings in the photo-sensitive layer 140, so that some regions of the mask layer 130 are exposed.

Figure 2:
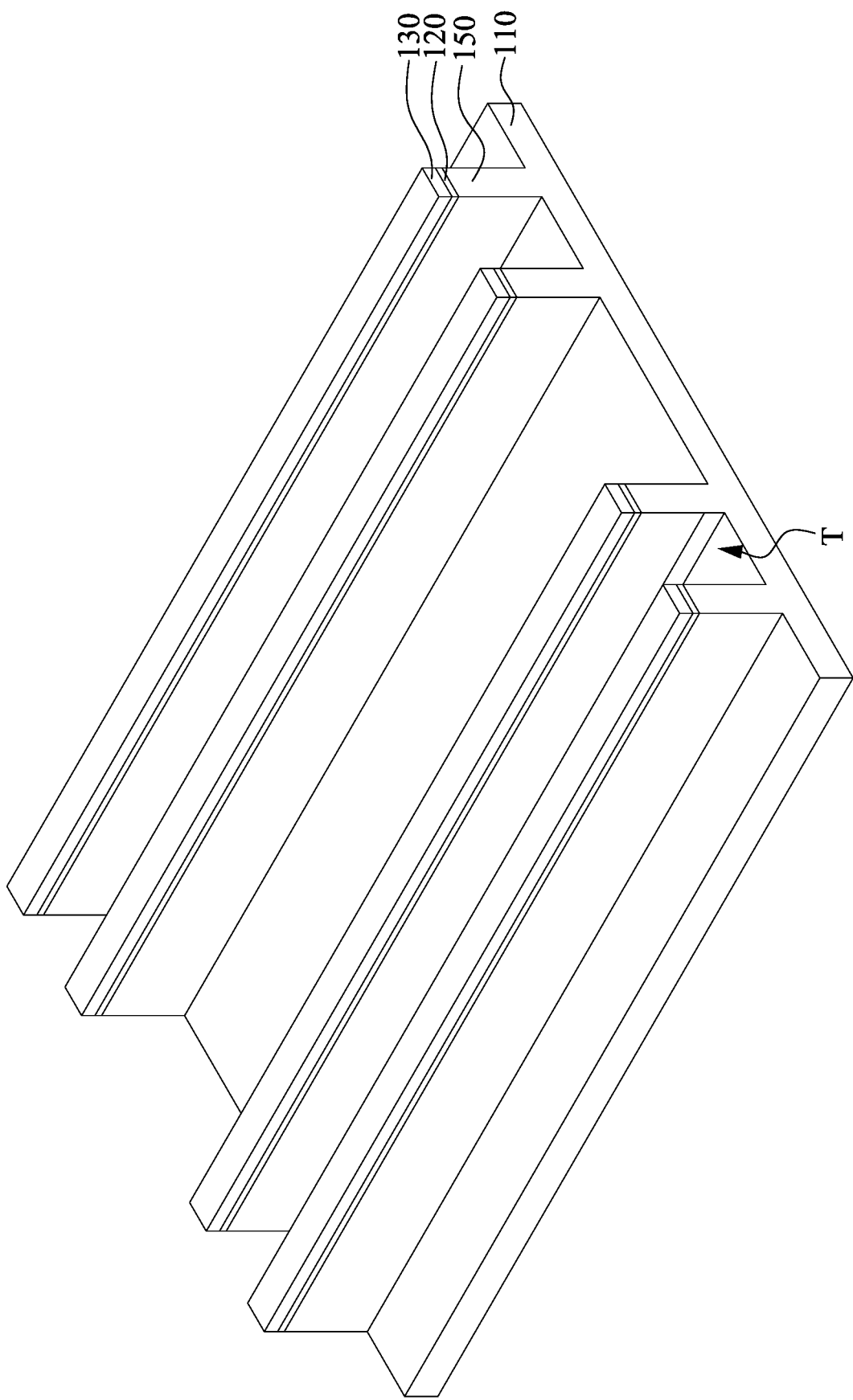

Reference is made to FIG. 2. The mask layer 130 and pad layer 120 are etched through the photo-sensitive layer 140, exposing underlying substrate 110. The exposed substrate 110 is then etched, forming trenches T. A portion of the substrate 110 between neighboring trenches T can be referred to as a semiconductor fin 150. Trenches T may be trench strips that are substantially parallel to each other. Similarly, the semiconductor fins are substantially parallel to each other. After etching the substrate 110, the photo-sensitive layer 140 is removed. Next, a cleaning step may be performed to remove a native oxide of the semiconductor substrate 110. The cleaning may be performed using diluted hydrofluoric (HF) acid, for example.

Figure 3:
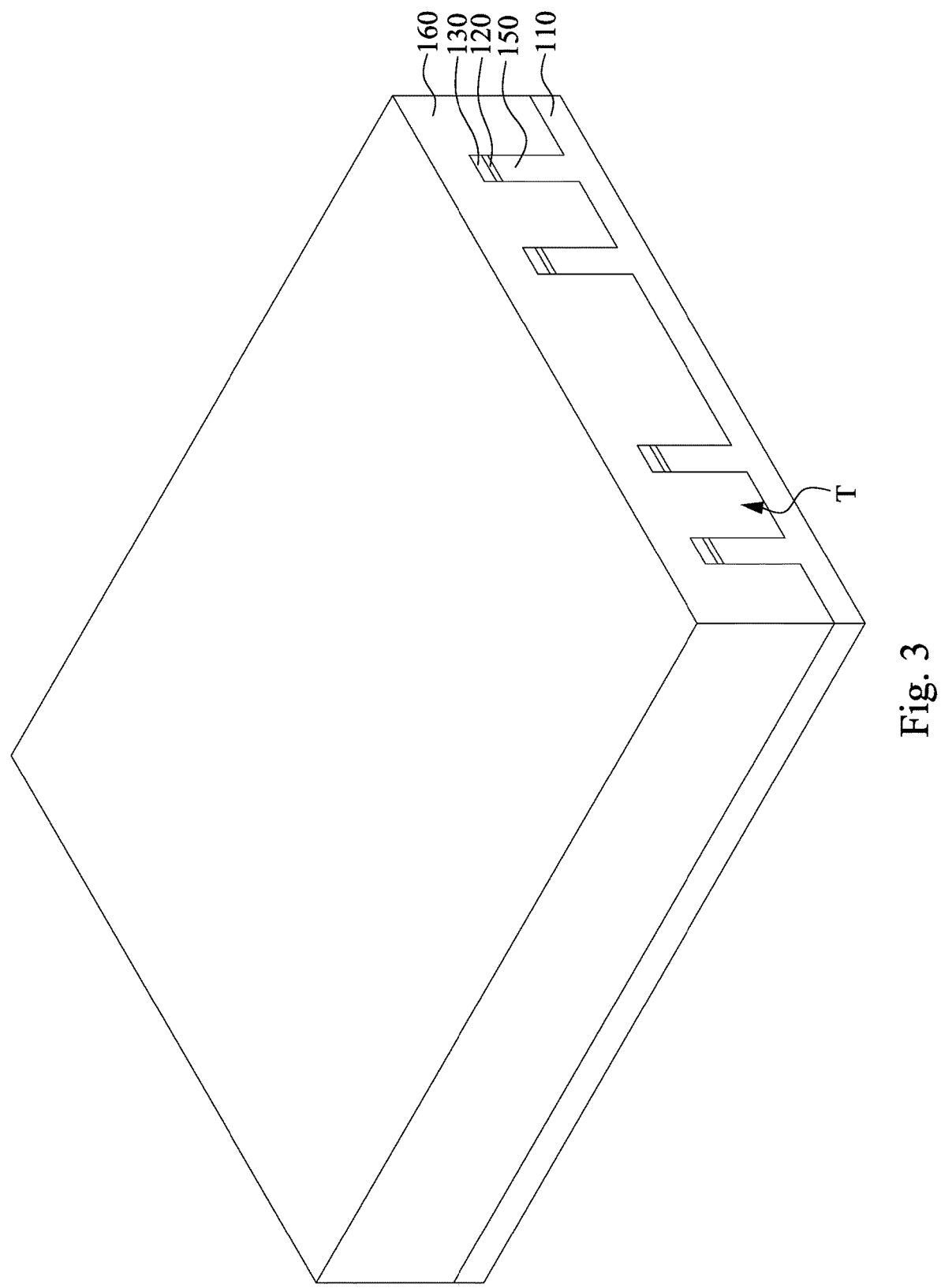

After photo-sensitive layer 140 is removed, an isolation dielectric 160 is formed to cover the semiconductor fin 150 over substrate 110, the isolation dielectric 160 may overfill the trenches T, and the resulting structure is shown in FIG. 3. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multilayer structure, for example, a thermal oxide liner layer with silicon nitride formed over the liner. Thereafter, a thermal annealing may be optionally performed to the isolation dielectric 160.

Figure 4:
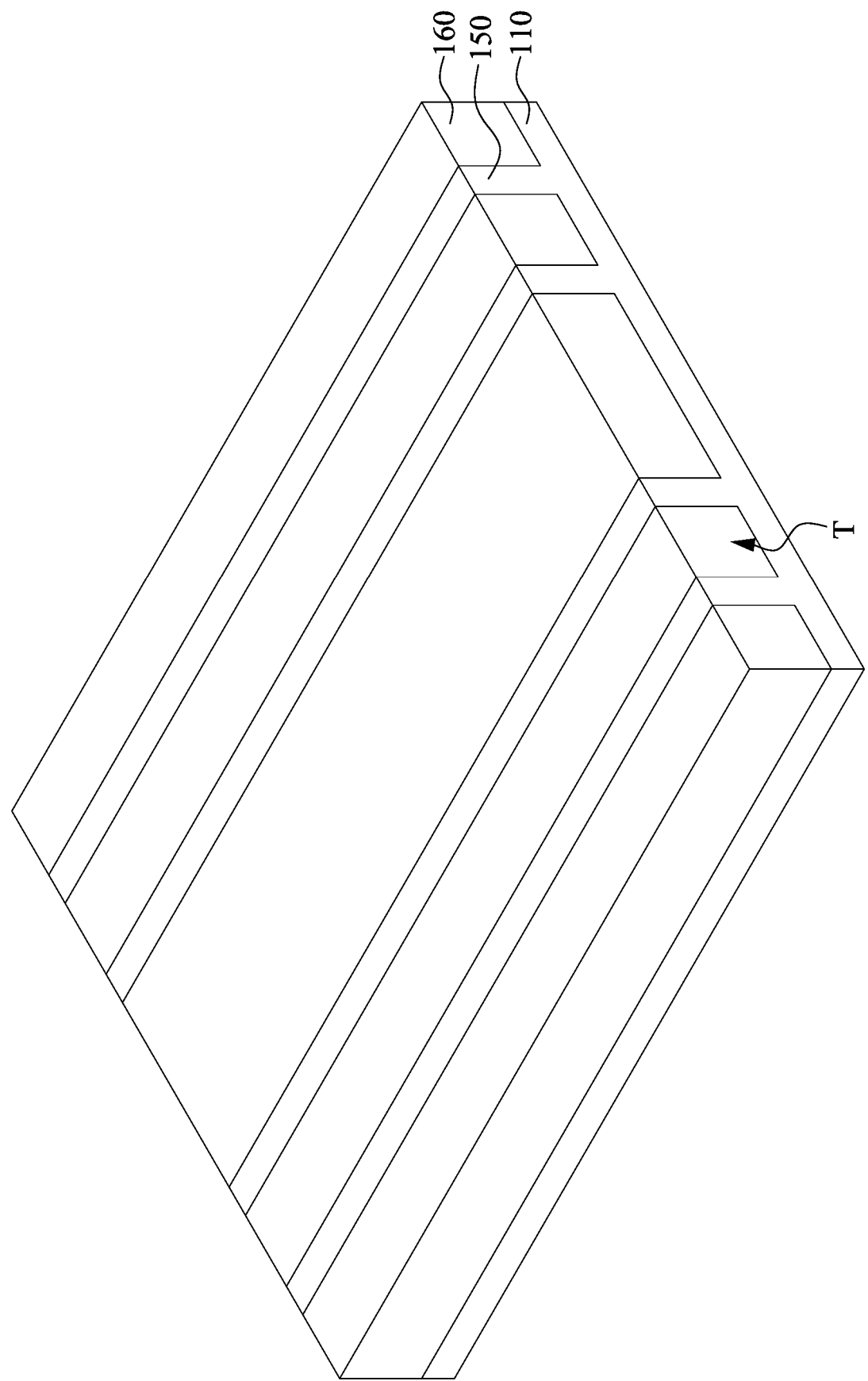

Next, a planarization process such as chemical mechanical polish (CMP) is then performed to remove the excess isolation dielectric 160 outside the trenches T, and the resulting structure is shown in FIG. 4. In some embodiments, the planarization process may also remove the mask layer 130 and the pad layer 120 such that top surfaces of the semiconductor fins 150 are exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 5:
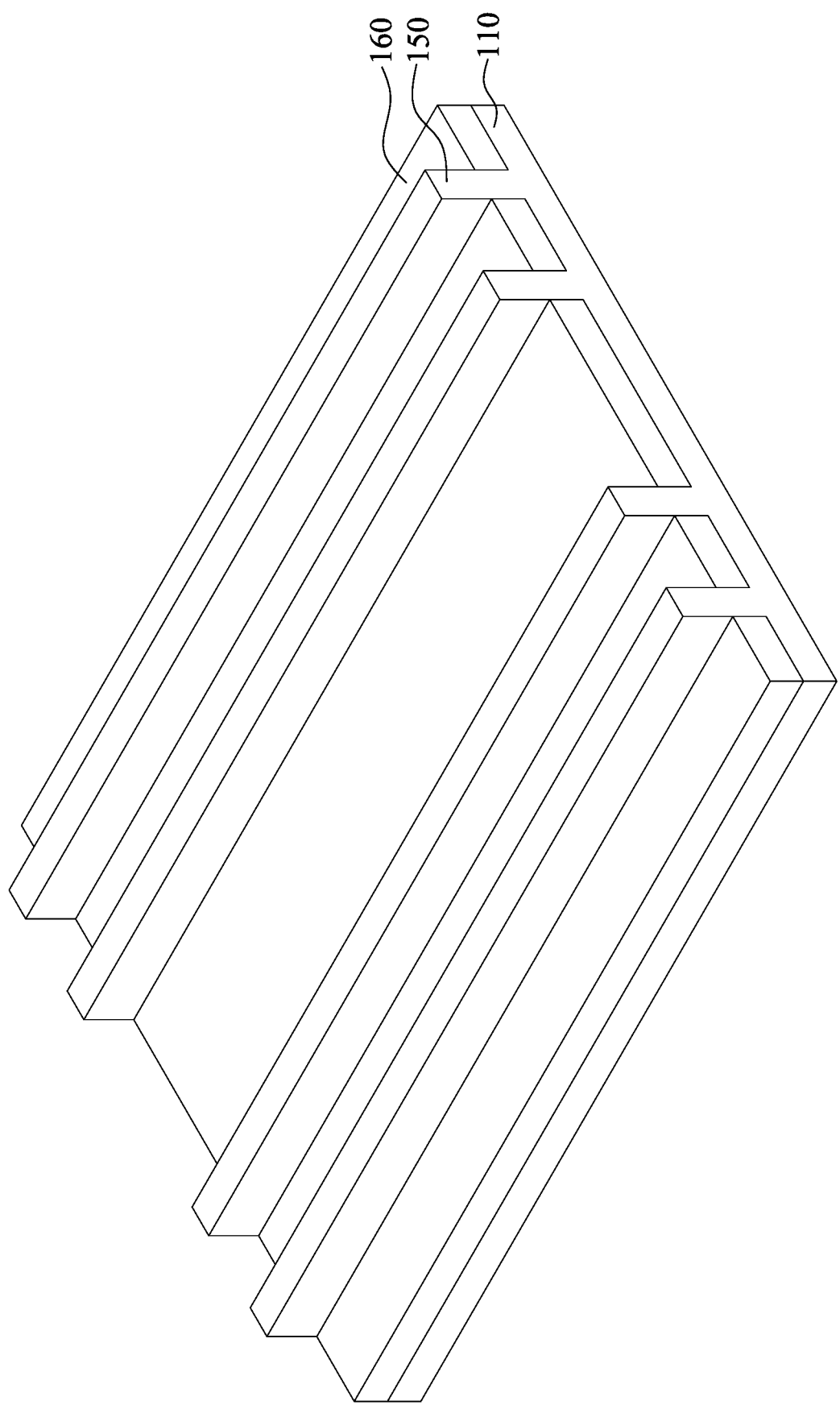

Next, as shown in FIG. 5, the isolation dielectric 160 is recessed, for example, through an etching operation, wherein diluted HF, SiCoNi (including HF and $NH_3$), or the like, may be used as the etchant. After recessing the isolation dielectric 160, a portion of the semiconductor fin 150 is higher than a top surface of the isolation dielectric 160, and hence this portion of the semiconductor fin 150 protrudes above the isolation dielectric 160.

It is understood that the processes described above are some examples of how semiconductor fins 150 and the STI structure are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, at least one of the semiconductor fins 150 can be recessed, and a material different from the recessed semiconductor fin 150 may be epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 150 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
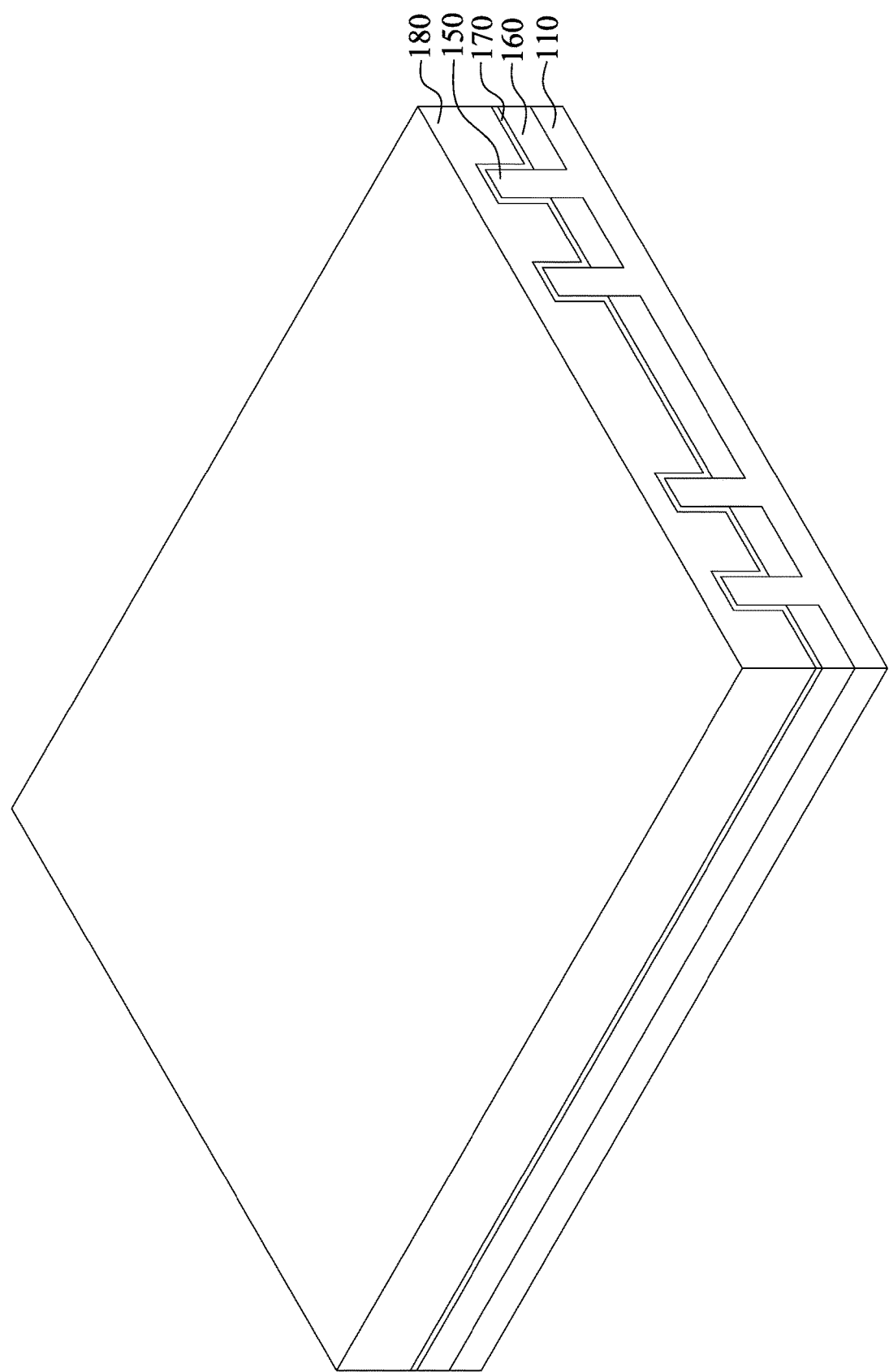

Reference is made to FIG. 6. A gate dielectric layer 170 is blanket formed over the substrate 110 to cover the semiconductor fins 150 and the isolation dielectric 160. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 170 is formed, a dummy gate electrode layer 180 is formed over the gate dielectric layer 170. In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 7:
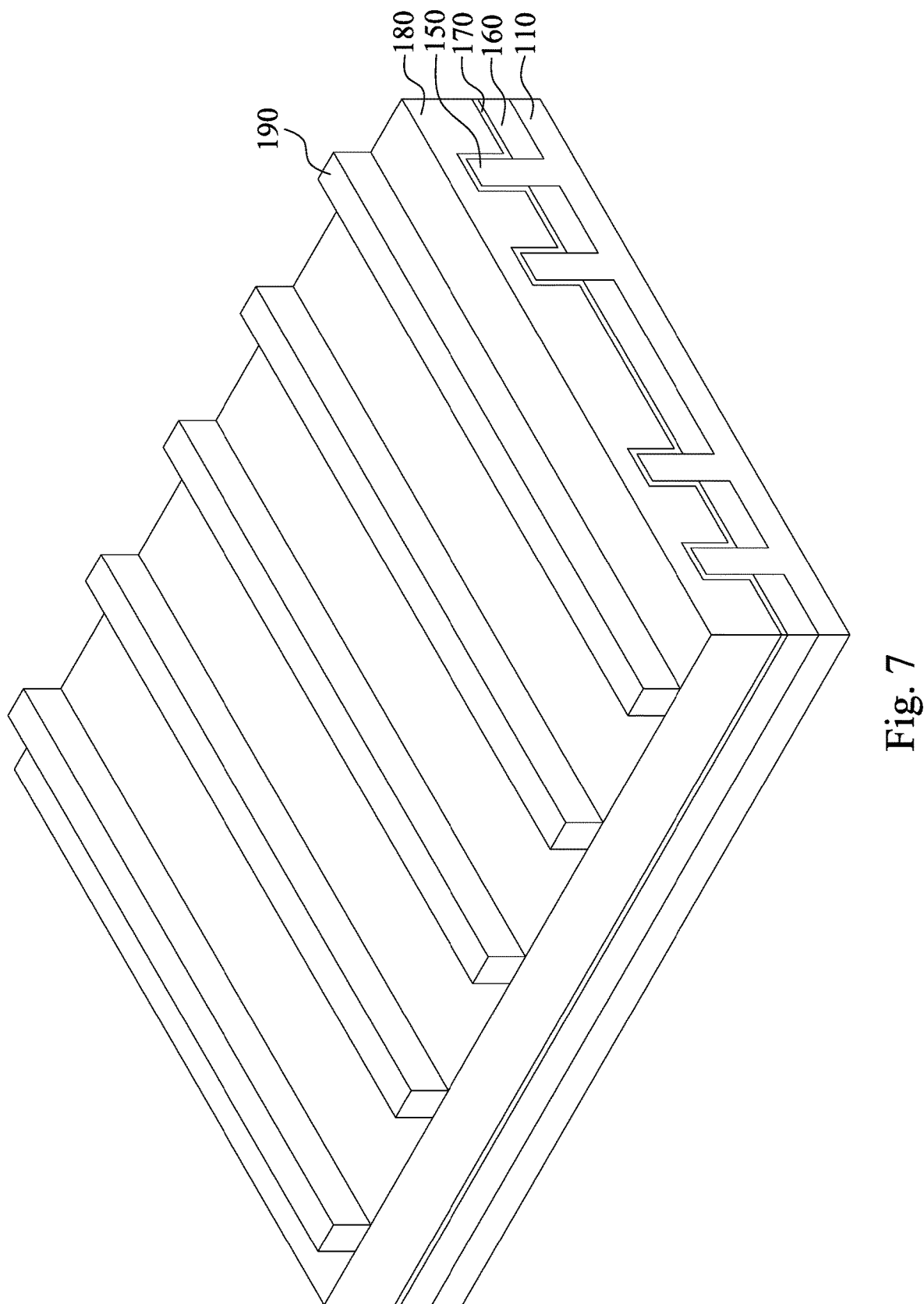

Next, the dummy gate electrode layer 180 and the gate dielectric layer 170 are patterned to form dummy gate structures in accordance with some embodiments. For example, a patterned mask 190 is formed over a portion of the dummy gate electrode layer 180, as shown in FIG. 7. The mask 190 may be a hard mask for protecting the underlying dummy gate electrode layer 180 and the gate dielectric layer 170 against subsequent etching process. The patterned mask 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 8:
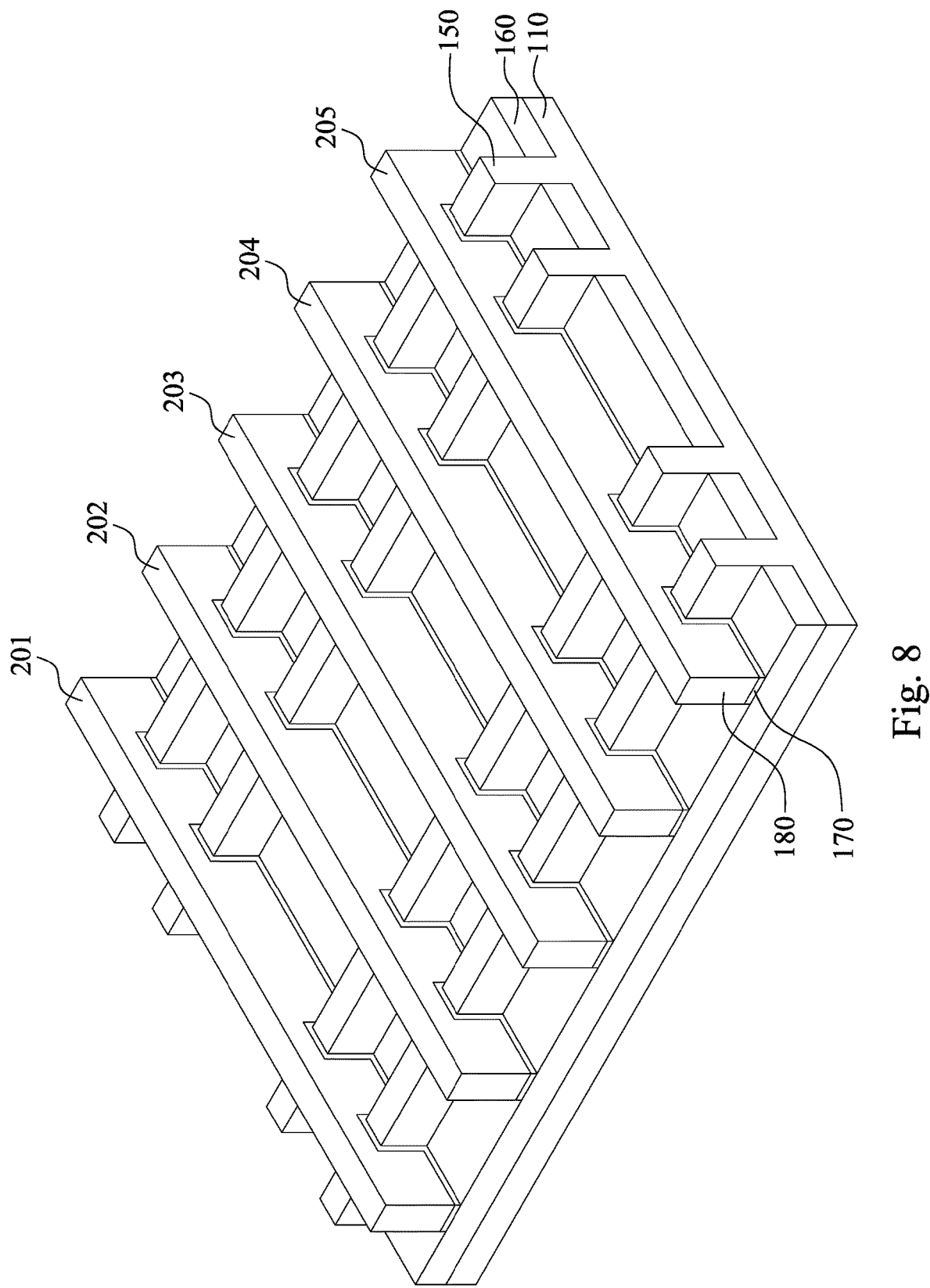

An etching process is performed to form dummy gate structures 201, 202, 203, 204 and 205 wrapping the semiconductor fins 150 using the patterned mask 190 as an etching mask, and the patterned mask 190 is removed after the etching. The resulting structure is shown in FIG. 8. Each dummy gate structure includes a gate dielectric layer 170 and a dummy gate electrode layer 180 over the gate dielectric layer 170. The dummy gate structures 201-205 have substantially parallel longitudinal axes that are substantially perpendicular to longitudinal axes of the semiconductor fins 150, as illustrated in FIG. 8. The dummy gate structures 201-205 will be replaced with a replacement gate structure using a "gate-last" or replacement-gate process.

Figure 9:
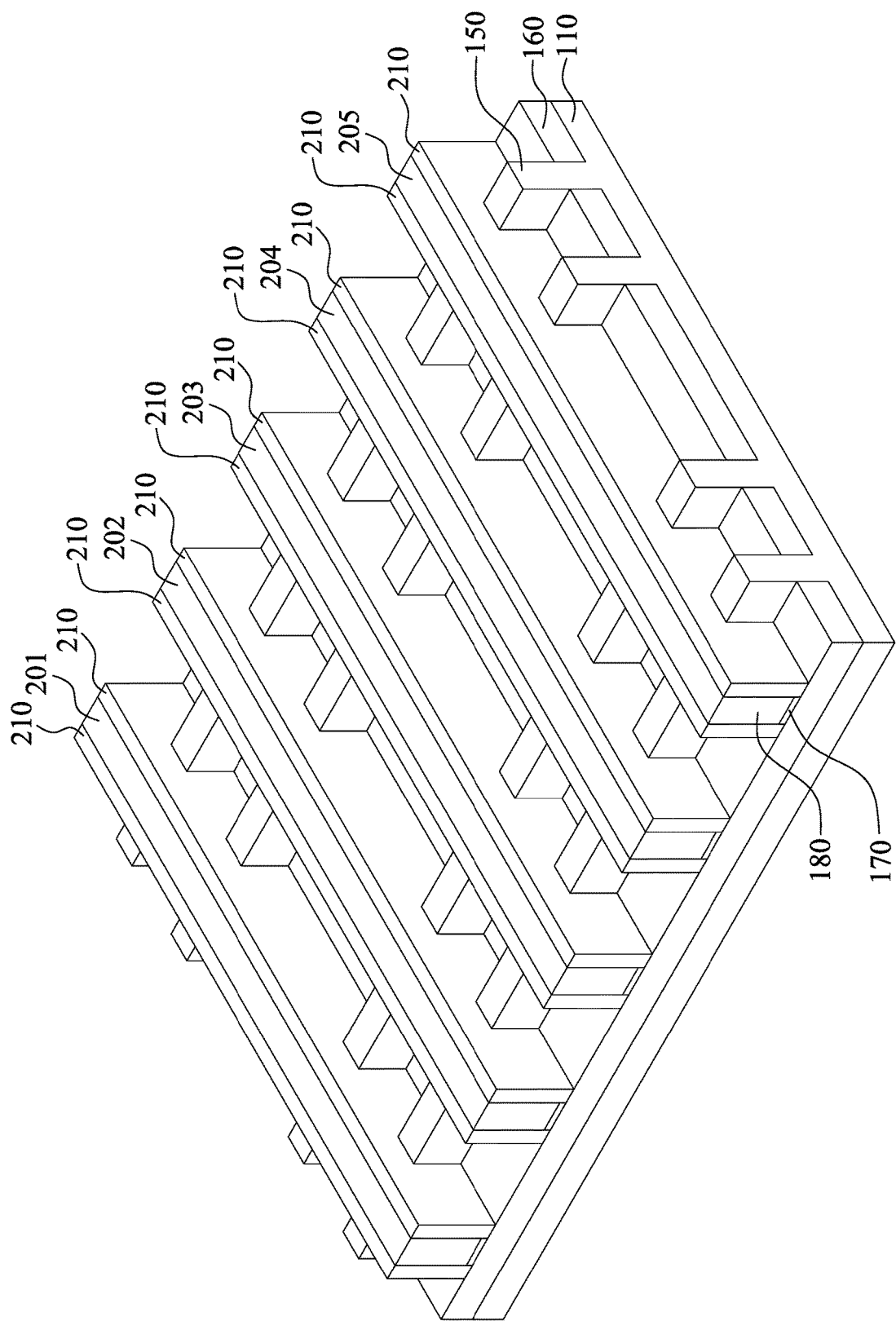

Reference is made to FIG. 9. Gate spacers 210 are formed on opposite sidewalls of the dummy gate structures 201-205. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 210 may include a single layer or multilayer structure made of different dielectric materials. The method of forming the gate spacers 210 includes blanket forming a dielectric layer on the structure shown in FIG. 8 using, for example, CVD, PVD or ALD, and then performing an etching process such as anisotropic etching to remove horizontal portions of the dielectric layer. The remaining portions of the dielectric layer on sidewalls of the dummy gate structures 201-205 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 10:
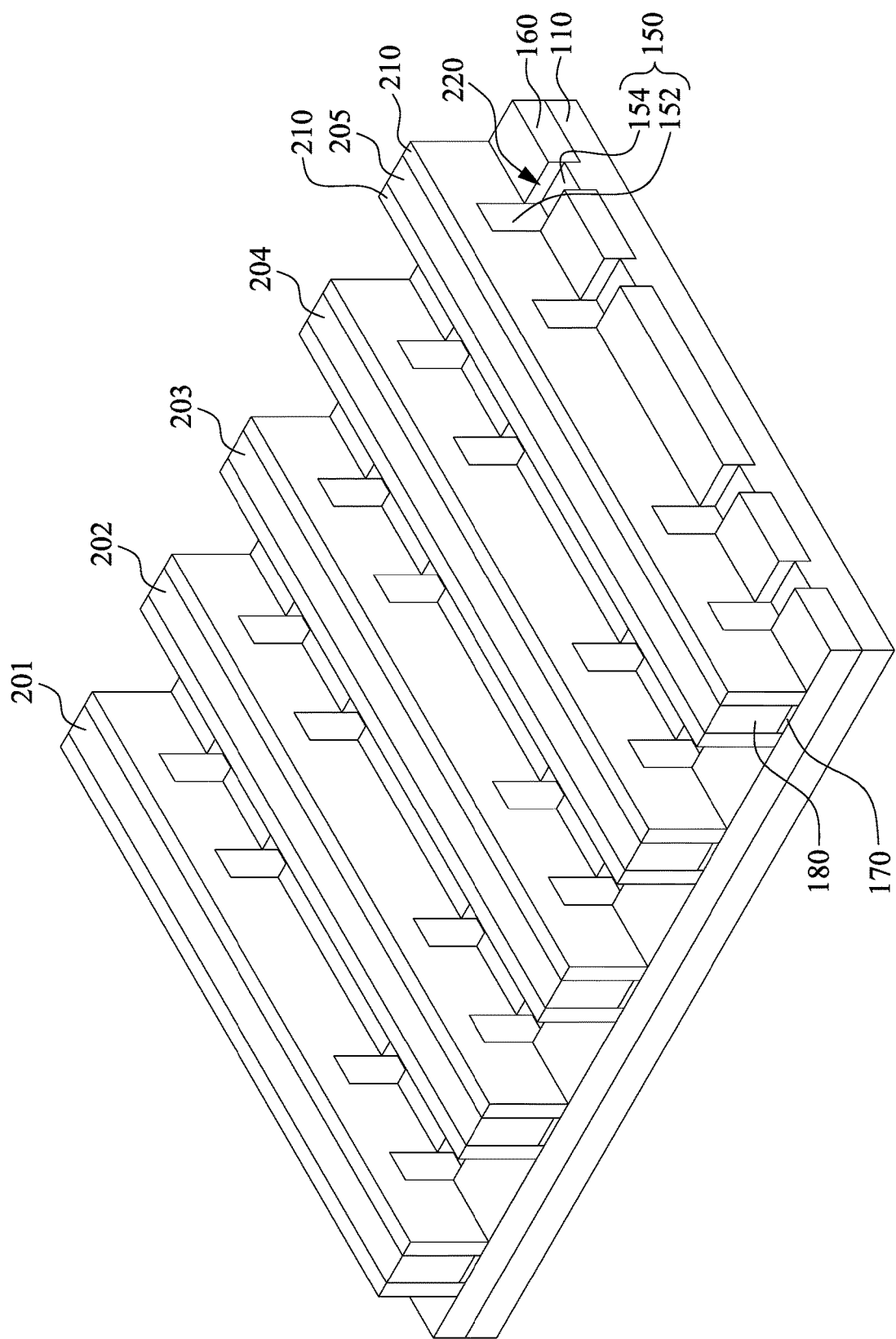

Reference is made to FIG. 10. Portions of the semiconductor fins 150 not covered by the dummy gate structures 201-205 and the gate spacers 210 are respectively partially removed (or partially recessed) to form recesses 220. The remaining semiconductor fin 150 may have a protruding portion 152 and embedded portions 154 after this removal. The embedded portions 154 are embedded in the isolation dielectric 160, and the embedded portions 154 are exposed by the recesses 220. The protruding portion 152 protrudes from the embedded portions 154 and is located between the recesses 220. The dummy gate structures 201-205 wrap the protruding portions 152, and hence the protruding portions 152 can act as channel regions of transistors. The embedded portions 154 spaced apart from the dummy gate structures 201-205 can act as source/drain regions of transistors.

Formation of the recesses 220 may include a dry etching process, a wet etching process, or combination dry and wet etching processes. This etching process may include reactive ion etch (RIE) using the dummy gate structures 201-205 and gate spacers 210 as masks, or by any other suitable removal process. In some embodiments, the etching process may be performed, for example, under a pressure of about 1 mTorr to 1000 mTorr, a power of about 10 W to 1000 W, a bias voltage of about 20 V to 500 V, at a temperature of about 40° C. to 60° C., using a HBr and/or $Cl_2$ as etch gases. After the etching process, a pre-cleaning process may be performed to clean the recesses 220 with hydrofluoric acid (HF) or other suitable solution in some embodiments.

Figure 11:
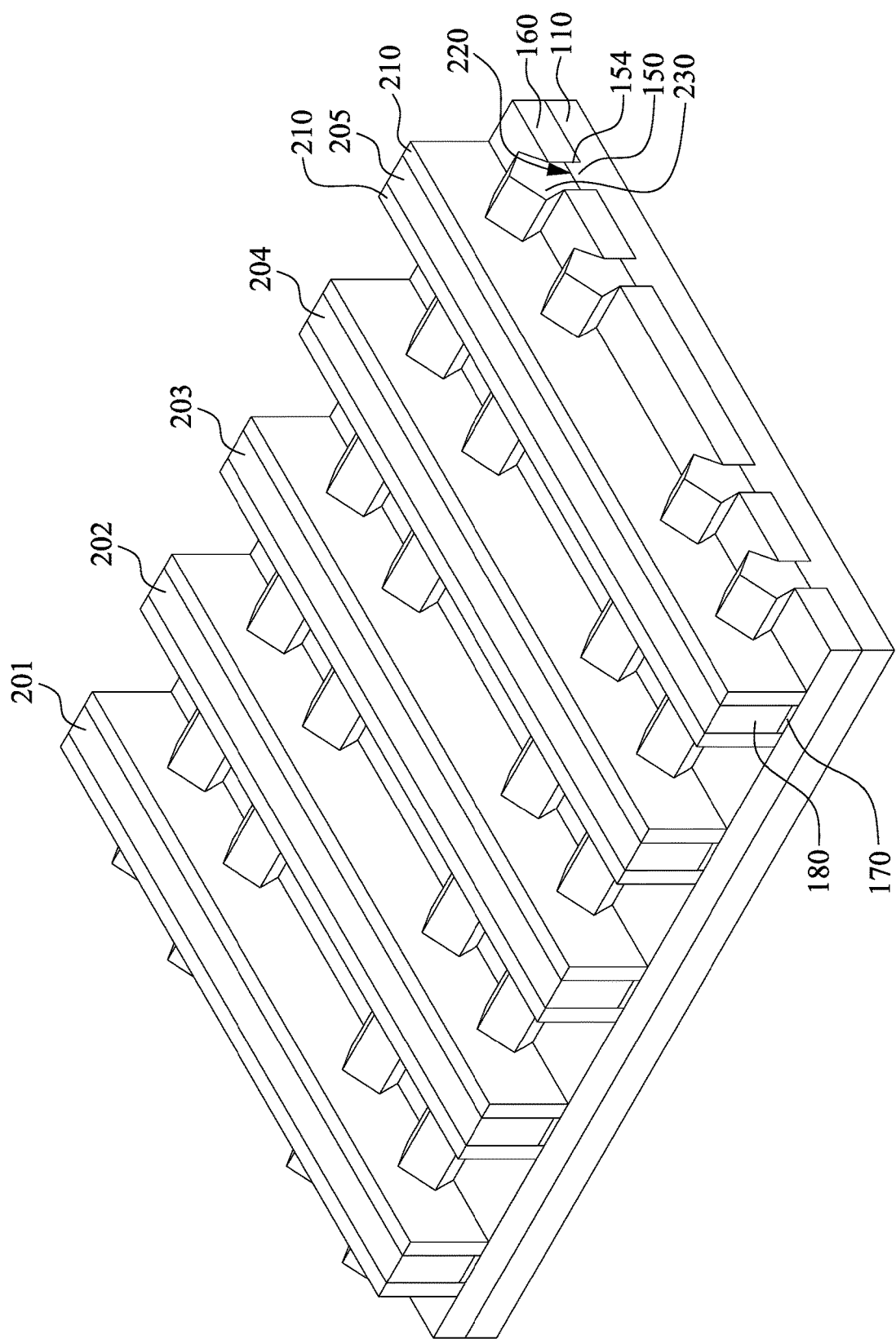

Reference is made to FIG. 11. Epitaxial source/drain structures 230 are respectively formed in the recesses 220. The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 154 of the semiconductor fins 150. In some embodiments, lattice constants of the epitaxial source/drain structures 230 are different from that of the semiconductor fins 150, so that the channel region between the epitaxial source/drain structures 230 can be strained or stressed by the epitaxial source/drain structures 230 to improve carrier mobility of the semiconductor device and enhance the device performance.

Specifically, the electron mobility increases and the hole mobility decreases when the tensile strain is applied in the channel region, and the electron mobility decreases and the hole mobility increases when the compress strain is applied in the channel region. Therefore, an n-type transistor with a stressor configured to provide tensile strain in the channel region would be beneficial, and a p-type transistor with a stressor configured to provide compress strain in the channel region would be beneficial as well. For example, in some embodiments where two source/drain structures 230 are used to form an n-type transistor, the source/drain structures 230 can act as stressors including, for example, SiP, SiC or SiCP, which is able to induce tensile strain to an n-type channel; in some embodiments where two source/drain structures 230 are used to form a p-type transistor, the source/drain structures 230 may include stressors including SiGe, which is able to induce compress strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 150 (e.g., silicon, silicon germanium, silicon phosphate, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the epitaxial source/drain structures 230. The annealing processes include rapid thermal annealing (RTA) and/or laser annealing processes.

Figure 12:
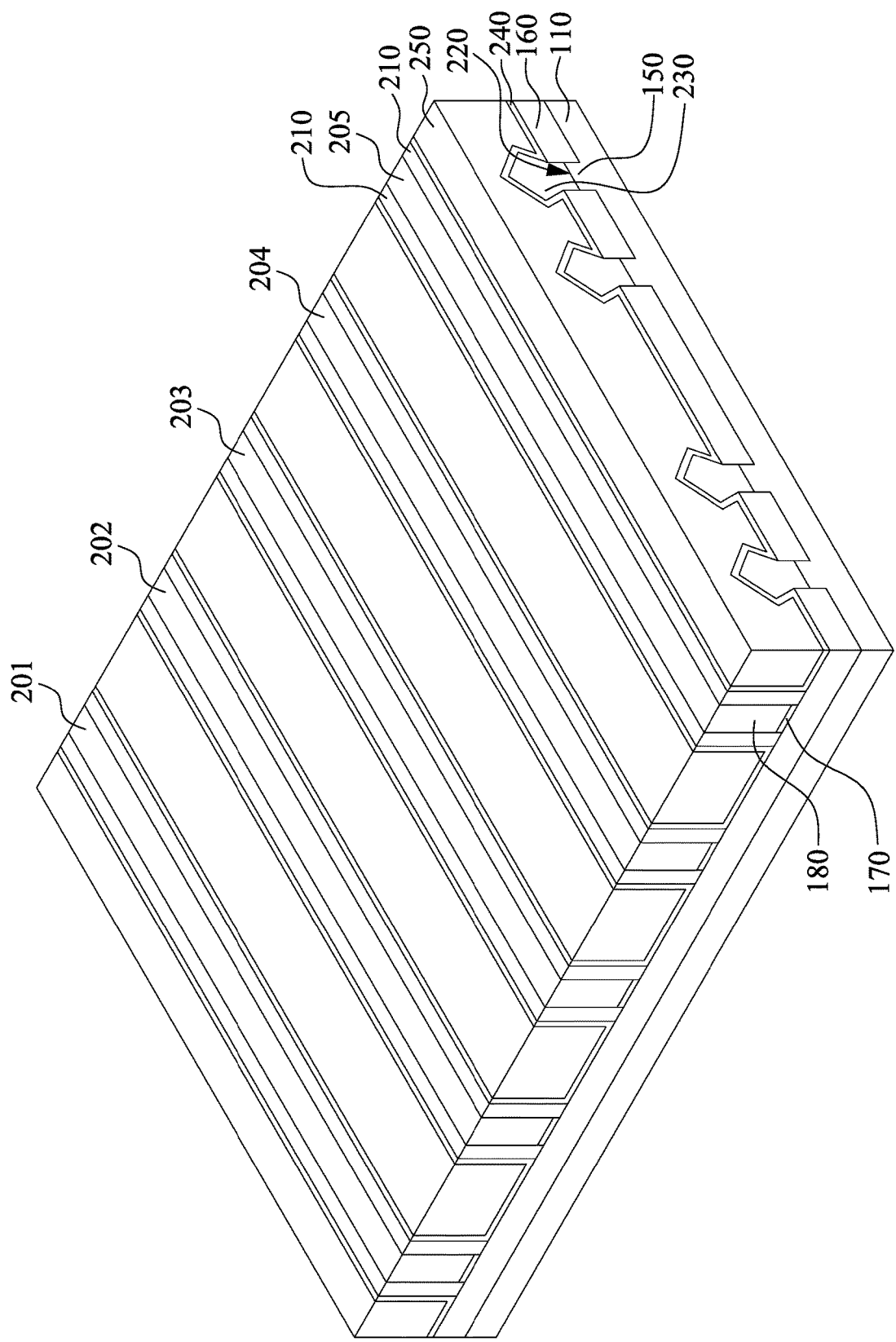

Reference is made to FIG. 12. A contact etch stop layer (CESL) 240 is blanket formed on the structure shown in FIG. 11, and then, an interlayer dielectric (ILD) layer 250 is formed on the CESL 240. Afterwards, a CMP process may be optionally performed to remove excessive material of the ILD layer 250 and the CESL 240 to expose the dummy gate structures 201-205. The CMP process may planarize a top surface of the ILD layer 250 with top surfaces of the dummy gate structures 201-205, gate spacers 210 and the CESL 240 in some embodiments. The CESL 240 includes silicon nitride, silicon oxynitride or other suitable materials. The CESL 240 can be formed using, for example, plasma enhanced CVD, low pressure CVD, ALD or other suitable techniques. The ILD layer 250 may include a material different from the CESL 240. In some embodiments, the ILD layer 250 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 250 may be formed using, for example, CVD, ALD, spin-on-glass (SOG) or other suitable techniques.

Figure 13:
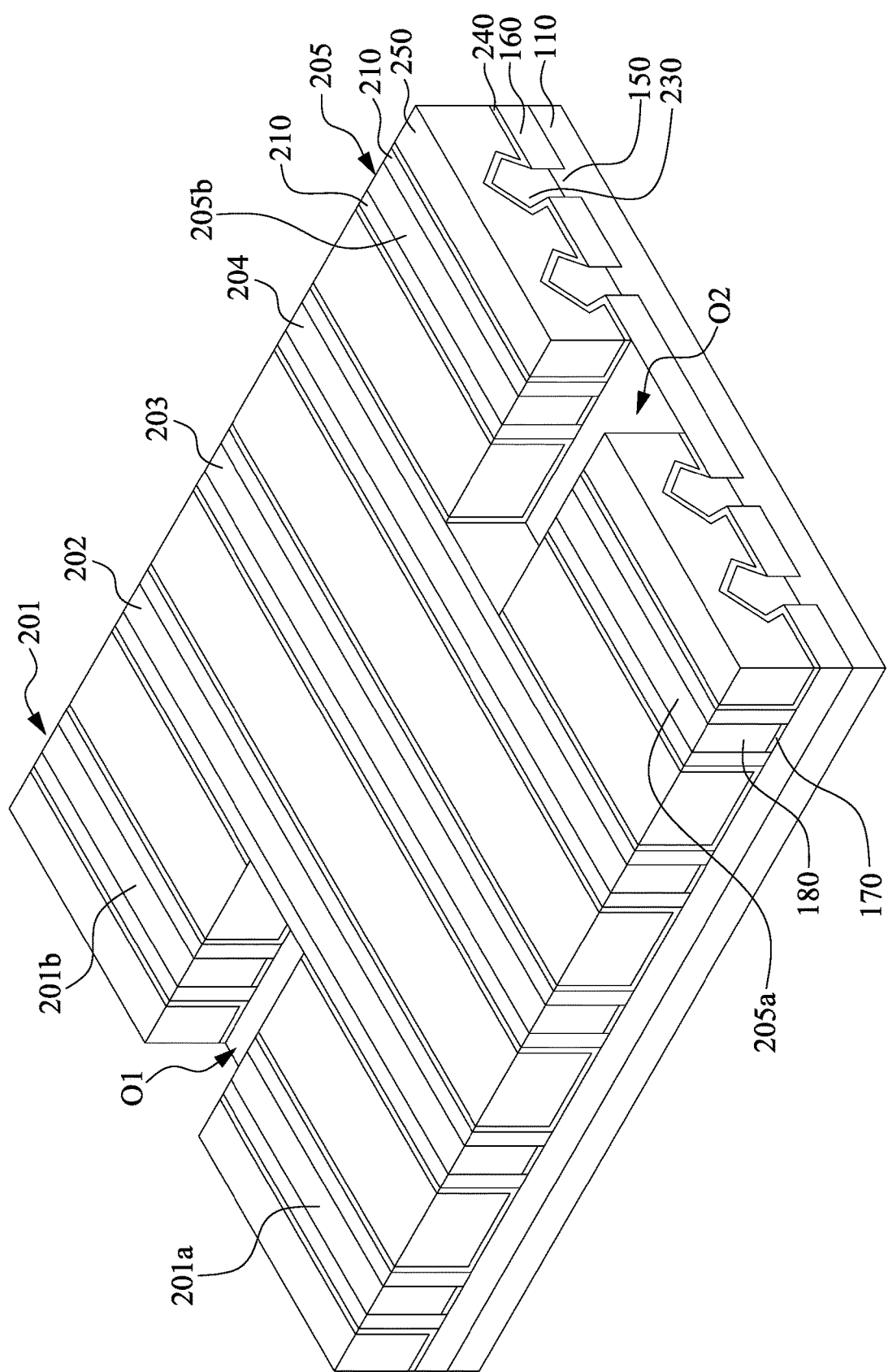

FIG. 13 illustrates cutting or separation of at least one dummy gate structure into individual and separated dummy gate portions in accordance with some embodiments. For example, one or more etching processes are performed to cut the dummy gate structures 201 and 205, so that an opening O1 is formed between individual dummy gate portions 201a and 201b, and an opening O2 is formed between individual dummy gate portions 205a and 205b. During the one or more etching processes, a patterned mask (not shown) can be formed to protect portions of the dummy gate structures 201-205 that are not to be removed, and the patterned mask can be removed after the one or more etching processes. In some embodiments, as illustrated, portions of gate spacers 210, the CESL 240 and the ILD layer 250 exposed by the patterned mask are removed by the one or more etching processes. In some embodiments where the dummy gate electrodes are formed of polysilicon, the openings O1 and O2 can be referred to as cut polysilicon (CPO) regions that cut the polysilicon gates.

Figure 14:
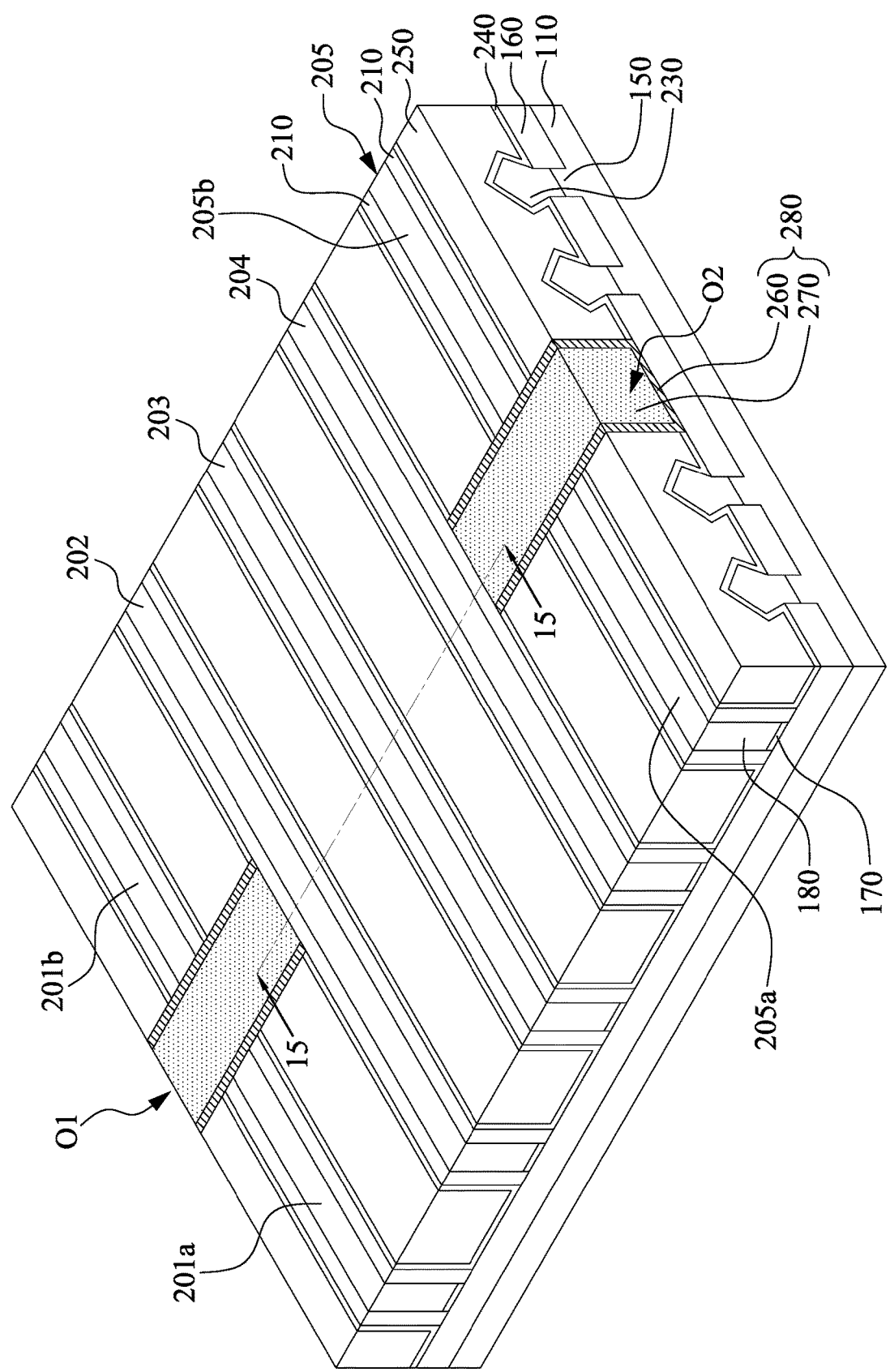
Figure 15:
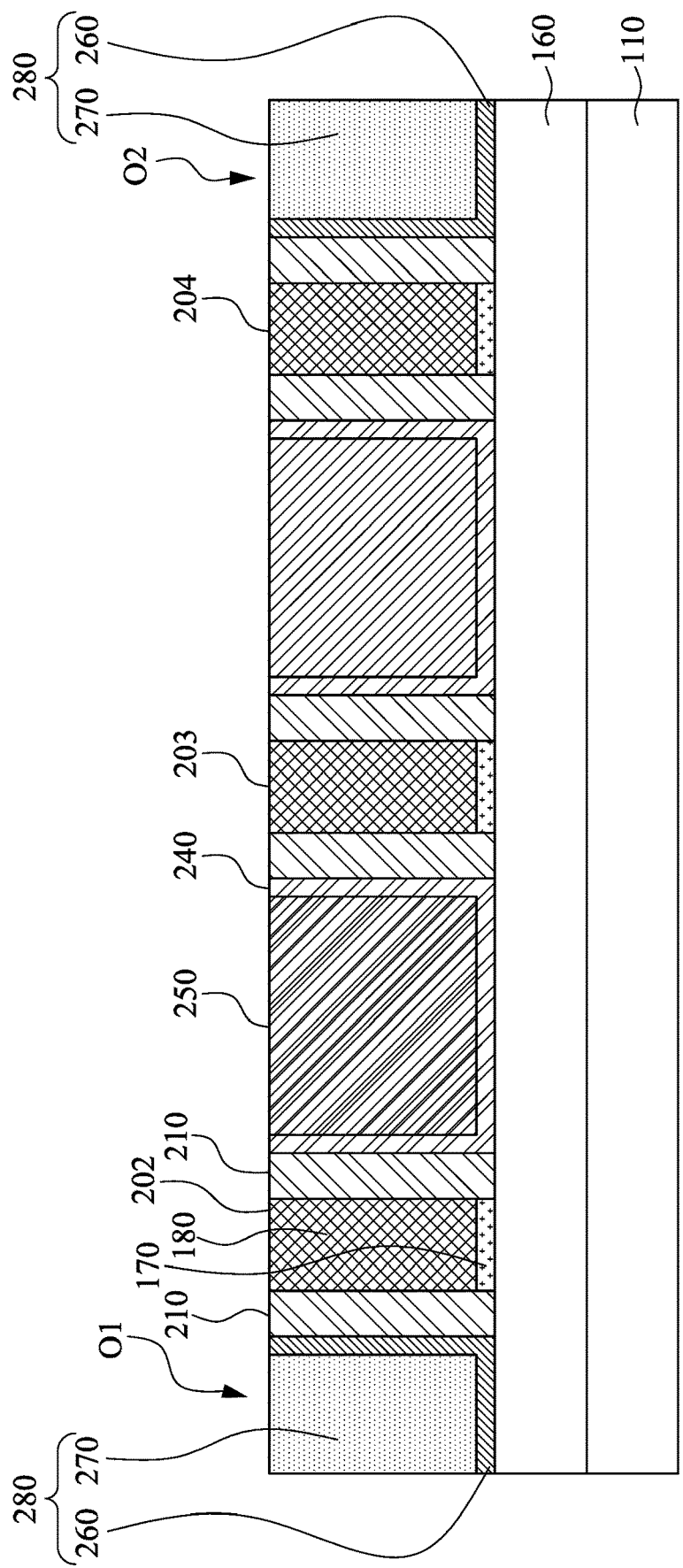

Next, an optional dielectric liner 260 is formed into the openings O1 and O2 to line sidewalls of the openings O1 and O2, and a dielectric feature (or called isolation feature) 270 is then formed to fill the remaining openings O1 and O2, and the dielectric feature 270 is thus referred to as a dielectric filling 270. Thereafter, a CMP process is performed to remove excess material of dielectric liner 260 and the dielectric filling 270 outside the openings O1 and O2, and the resulting structure is shown in FIGS. 14 and 15, wherein FIG. 15 is a cross-sectional view taken along line 15 in FIG. 14. The remaining dielectric liner 260 and the dielectric filling 270 can be in combination referred to as CPO features 280 in the openings O1 and O2. In following steps, the CPO features 280 can be contracted so as to improve a gate replacement process window and/or to induce tensile strain to its neighboring channel regions, which are discussed in detail below.

In some embodiments, the dielectric liner 260 has good isolation and protection for the neighboring dummy gate portions, such as dummy gate portions 201a and 201b or dummy gate portions 205a and 205b. For example, the dielectric liner 260 is a nitride layer, such as a silicon nitride layer with a thickness in a range from about 20 angstroms to about 60 angstroms, formed using suitable deposition techniques such as atomic layer deposition (ALD) or CVD. However, since the nitride layer is a dense material that is hard to be contracted, a majority of the openings O1 and O2 can be filled with a more contractible dielectric filling 270 to benefit sufficient contraction of the CPO features 280.

In some embodiments, the dielectric filling 270 is a flowable dielectric material that can be deposited into a recess of the dielectric liner 260 using a flowable CVD (FCVD). Since the flowable dielectric material can shrink as it densifies, the dielectric filling 270 can be contracted in a subsequent step using suitable techniques, and hence the contraction of the CPO features 280 can be achieved. In some embodiments, the flowable dielectric filling 270 may comprise a flowable oxide such as a flowable silicon oxide. The flowable dielectric filling 270 is formed by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a perhydro-polysilazane (PSZ). Alternatively, the flowable dielectric filling 270 can be formed by using a low temperature plasma chemical vapor deposition at a temperature less than about 100° C. under a pressure ranging from about 100 mTorr to about 10 Ton. The dielectric filling 270 has a thickness in a range from about 200 angstroms to about 300 angstroms, for example. In some embodiments, the dielectric liner 260 is also a flowable dielectric material, such as a flowable silicon nitride. In some embodiments, the dielectric filling 270 has higher flowability than that of the dielectric liner 260 so as to improve the contraction of the CPO features 280.

Figure 16:
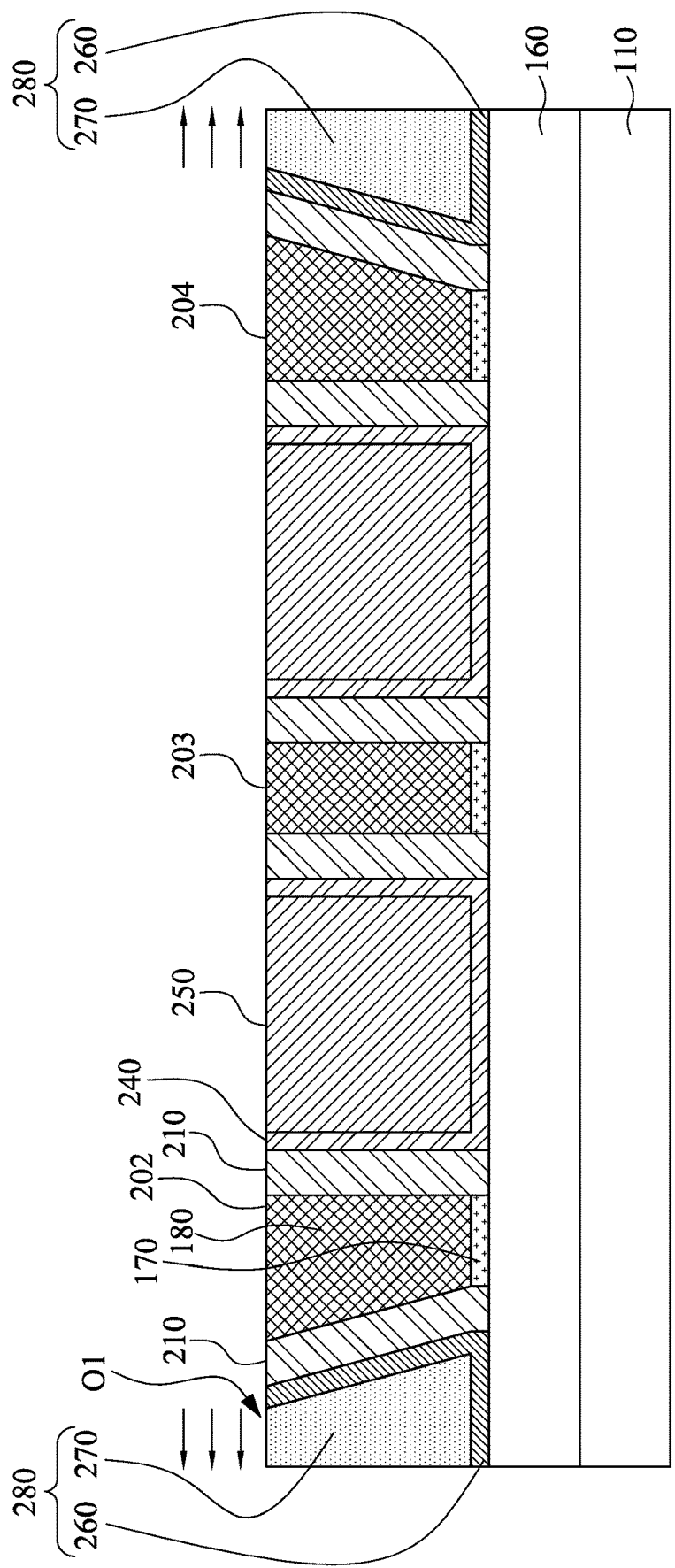

FIG. 16 illustrates contraction of the CPO features 280. For example, a thermal process, such as an annealing process, is performed to contract the CPO features 280. In some embodiments, the annealing process may be performed, for example, at a temperature of between about 500° C. to about 650° C., for a time of between about 30 minutes to about 120 minutes, and/or at a pressure of about 1 atmosphere. In other embodiments, other temperatures, times, and pressures may be employed in order to achieve desired contraction. In some embodiments, the CMP process for removing excess material of dielectric liner 260 and the dielectric filling 270 is performed prior to the annealing process. In alternative embodiments, the CMP process for removing excess material of dielectric liner 260 and the dielectric filling 270 can be performed after the annealing process.

In some embodiments, the annealing process densifies the flowable dielectric filling 270, and the flowable dielectric filling 270 can contract or shrink (as represented by the arrows in FIG. 16) as it densifies. In some embodiments, the annealing process causes elements such as, for example, nitrogen and hydrogen, to be off gassed from dielectric filling 270. When the elements are off gassed, the dielectric filling 270 contracts or shrinks as well. The contraction of the dielectric filling 270 bends or otherwise deforms the dielectric liner 260, and hence a sidewall profile of the dielectric filling 270 is substantially the same as a sidewall profile of the dielectric liner 260. In some embodiments, the dielectric liner 260 contracts during the annealing process as well, and the contraction of the dielectric filling 270 is greater than the contraction of the dielectric liner 260 because the dielectric liner 260 is denser than the dielectric filling 270 before performing the annealing process. In some other embodiments, the dielectric liner 260 is free of contraction during the annealing process.

The contraction or shrinking of the CPO features 280 bends or otherwise deforms their neighboring gate spacers 210, as shown in FIG. 16. Indeed, the gate spacers 210 neighboring the contracted CPO features 280 are bent or curved relative to the substantially straight or unbent gate spacers 210 that are farther away from the contracted CPO features 280. In some embodiments, a contour of the contracted CPO feature 280 is equivalent to a contour of the bent gate spacer 210.

Still referring to FIG. 16, the bending or deformation of the gate spacers 210 laterally expands or otherwise enlarges the dummy gate structures 202 and 204 that abut the bent gate spacers 210. Indeed, the gate spacers 210 are drawn toward the CPO features 280 by the shrinking CPO features 280, which provide additional surface area where gate structures are subsequently formed over the substrate 110 to replace the dummy gate structures 202 and 204. In other words, an amount of deformation of the gate spacers 210 is due to the contracted CPO features 280 and contributes to expansion of the dummy gate structures 202 and 204, and hence an improved replacement gate process window can be provided. Stated differently, a distance between the gate spacers 210 on opposite sides of the dummy gate structure 202 or 204 is increased due to bending of the gate spacer 210 proximate the CPO feature 280, and the increased distance allows for an enlarged replacement gate process window. Moreover, the expanded or enlarged dummy gate structures 202 and 204 allow for longer channels and tensile strain for the channels, and hence the channels can be suitable for forming n-type transistors.

In some embodiments, top portions of the gate spacers 210 is deformed more than bottom portions of the gate spacers 210, and hence the gate spacers 210 have sloped profiles. Due to the sloped profiles, a distance between the gate spacers 210 on opposite sides of the dummy gate structure 202 or 204 increases as the height increases. In other words, the dummy gate structures 202 and 204 have widths that increase as the height increases. It is understood that the depicted profiles of the gate spacers 210 and CPO features 280 are illustrative examples, not intended to limit the present disclosure.

Figure 17:
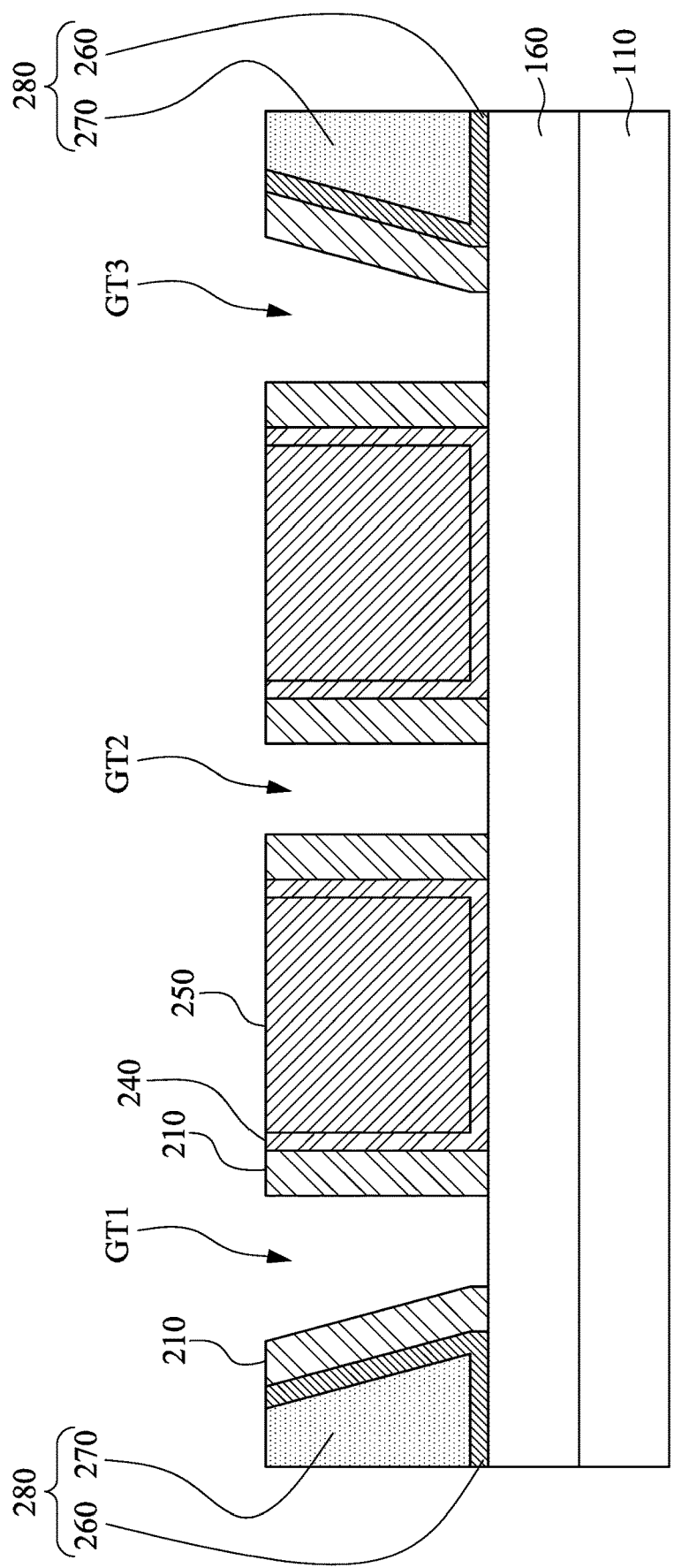

FIG. 17 illustrates removal of remaining dummy gate structures. For example, dummy gate structures 202, 203 and 204 are removed to form gate trenches GT1, GT2 and GT3 with the gate spacers 210 as their sidewalls. In some embodiments, the dummy gate structures are removed by performing a first etching process and performing a second etching process after the first etching process. In some embodiments, the dummy gate electrode layer 180 is mainly removed by the first etching process, and the gate dielectric layer 170 is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W. In some embodiments, the dummy gate electrode layer 180 is removed, while the gate dielectric layer 170 remains in the gate trenches.

As illustrated in FIG. 17, the gate trench GT1 has a width greater than a width of the gate trench GT2 because the gate trench GT1 has a bent gate spacer 210 as its sidewall. Similarly, the gate trench GT3 has a width greater than the width of the gate trench GT2 because the gate trench GT3 has a bent gate spacer 210 as it sidewall as well. Therefore, the gate trenches GT1 and GT3 are wider than the gate trench GT2, and hence an enlarged gate replacement process window can be provided.

Figure 18:
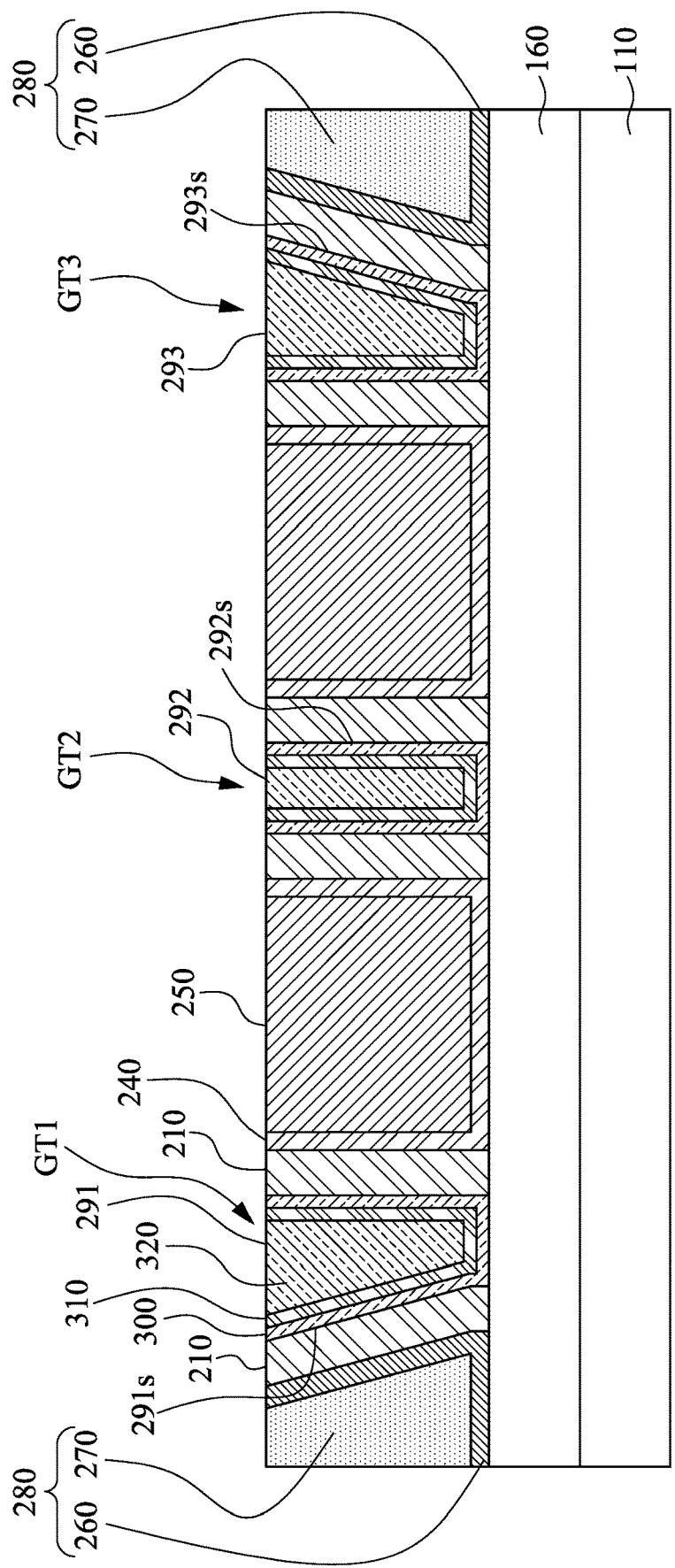

FIG. 18 illustrates formation of replacement gates. For example, gate structures 291, 292 and 293 are respectively formed in the gate trenches GT1, GT2 and GT3. Exemplary method of forming these gate structures may include blanket forming a layer of gate dielectric 300 over the structure shown in FIG. 17, forming one or more layers of work function conductor 310 over the blanket gate dielectric layer 300, forming a layer of filling conductor 320 over the one or more layers of work function conductor 310, and performing a CMP process to remove excessive materials of the filling conductor 320, the work function conductor 310 and the gate dielectric 300 outside the gate trenches.

As illustrated, the gate structures 291 and 293 are respectively formed in the gate trenches GT1 and GT3 that are wider than the gate trench GT2, so that the gate-filling window for the gate structures 291 and 293 are improved. Moreover, since the gate trenches GT1 and GT3 are wider than the gate trench GT2, the gate structures 291 and 293 have widths greater than a width of the gate structure 292 formed in the gate trench GT2. For example, a difference between the widths of the gate structures 291 and 292 is in a range from about 3 nm to about 4 nm. In some embodiments, the gate structure 291 has a sidewall profile different from a sidewall profile of the gate structure 292 because a sidewall 291s of the gate structure 291 is conformal to the bent gate spacer 210. Specifically, a contour of the sidewall 291s of the gate structure 291 is equivalent to a contour of the bent gate spacer 210, and hence the sidewall 291s of the gate structure 291 may be sloped or curved. For the same reason as described above, the gate structure 293 may have a sloped or curved sidewall 293s with a different profile from a sidewall 292s of the gate structure 292. In some embodiments, the gate structures 291 and 293 expand in a direction away from the substrate 110. It is understood that the depicted profiles of the gate structures 291 and 293 are illustrative examples, not intended to limit the present disclosure.

Each gate structure (e.g. gate structure 291, 292 or 293) include a gate dielectric 300, a work function conductor 310 on the gate dielectric 300 and a filling conductor 320 on the work function conductor 310, in which the work function conductor 310 and the filling conductor 320 can be collectively referred to as a gate conductor. If the gate conductor is made of metals, it can be referred to as a gate metal. The gate dielectrics 300 of the gate structure 291, 292 and 293 are conformally formed in the gate trenches GT1, GT2 and GT3, and hence the gate dielectrics 300 of the gate structures 291 and 293 have contours different from a contour of the gate dielectric 300 of the gate dielectric structure 292. The work function conductors 310 of the gate structures 291, 292 and 293 are conformally formed over the gate dielectrics 300, and hence the work function conductors 310 of the gate structures 291 and 293 have contours different from a contour of the work function conductor 310 of the gate dielectric structure 292. The filling conductors 320 of the gate structures 291, 292 and 293 fill recesses of the work function conductors 310 with different contours, and hence the filling conductors 320 of the gate structures 291 and 293 have contours different from a contour of the filling conductor 320 of the gate structure 292.

In some embodiments, the gate dielectric 300 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric 300 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric 300 may have a multilayer structure such as one layer of silicon oxide (e.g., interfacial layer) and another layer of high-k material.

The work function conductor 310 over the gate dielectric 300 includes work function metals to provide a suitable work function for the gate structure 290. In some embodiments, the work function conductor 310 may include one or more n-type work function metals (N-metal) for forming an n-type transistor on the substrate 110. The n-type work function metals may exemplarily include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductor 310 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, since the channels wrapped by the gate structures 291 and 293 are tensile strained due to the contracted CPO features 280, the gate structures 291 and 293 may include n-type work function metals to form n-type transistors with tensile strained channels. Moreover, in some embodiments, since the channel wrapped by the gate structure 292 is not tensile strained, the gate structure 292 may include the p-type work function metal to form a p-type transistor.

The filling conductor 320 fills a recess in the work function conductor 310. The filling conductor 320 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

As described above, embodiments of the present disclosure utilizes contraction of CPO features to improve the gate replacement process window and/or to induce tensile strain to the neighboring channel regions. Therefore, these embodiments can be applied to devices with CPO features, especially devices with high CPO density. For example, embodiments of the present disclosure can be applied to static random-access memory (SRAM) as discussed below.

Figure 19:
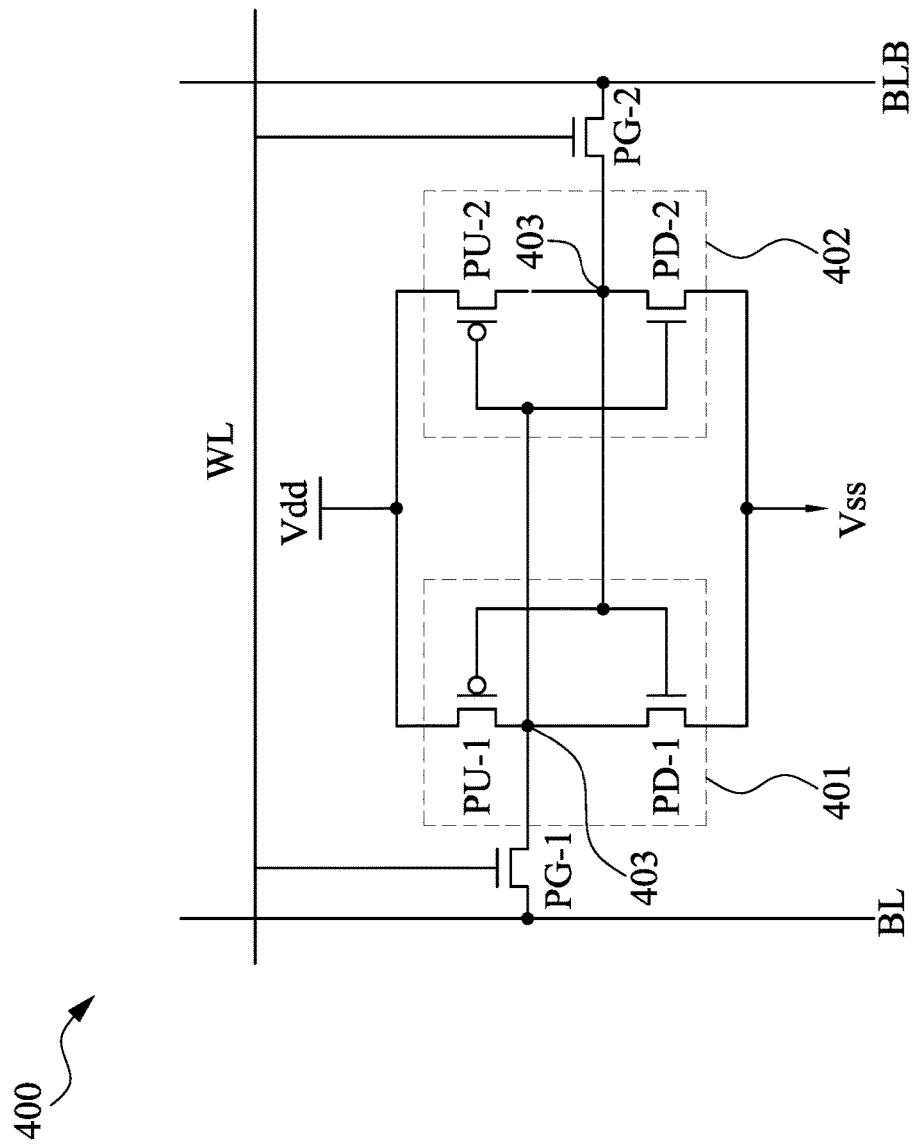
FIG. 19 is a circuit diagram of an SRAM cell in accordance with some embodiments of the present disclosure.

SRAM is a type of volatile semiconductor memory that uses bistable latching circuitry to store each bit. Each bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) serve to control the access to a storage cell during read and write operations. An SRAM uses six MOSFETs to store each memory bit. FIG. 19 is a circuit diagram of a six transistor (6T) SRAM cell 400 in accordance with some embodiments of the present disclosure. The SRAM cell 400 comprises a first inverter 401 formed by a pull-up p-type metal oxide semiconductor (PMOS) transistor PU-1 and a pull-down n-type metal oxide semiconductor (NMOS) transistor PD-1. The SRAM cell 400 further comprises a second inverter 402 formed by a pull-up PMOS transistor PU-2 and a pull-down NMOS transistor PD-2. Furthermore, the first inverter and second inverter are coupled between a voltage bus Vdd and a ground potential Vss.

As shown in FIG. 19, the first inverter 401 and the second inverter 402 are cross-coupled. That is, the first inverter 401 has an input connected to the output of the second inverter 402. Likewise, the second inverter 402 has an input connected to the output of the first inverter 401. The output of the first inverter is referred to as a storage node SN 403. Likewise, the output of the second inverter is referred to as a storage node SNB 404. In a normal operating mode, the storage node SN 403 is in the opposite logic state as the storage node SNB 404. By employing the two cross-coupled inverters, the SRAM cell 400 can hold the data using a latched structure so that the stored data will not be lost without applying a refresh cycle as long as power is supplied through Vdd.

In an SRAM array (not shown) using the 6T SRAM cells, the cells are arranged in rows and columns. The columns of the SRAM array are formed by a bit line pairs, namely a first bit line BL and a second bit line BLB. The cells of the SRAM array are disposed between the respective bit line pairs. As shown in FIG. 19, the SRAM cell 400 is placed between the bit line BL and the bit line BLB.

As shown in FIG. 19, the SRAM cell 400 further comprises a first pass-gate transistor PG-1 connected between the bit line BL and the output 403 of the first inverter. The SRAM cell 400 further comprises a second pass-gate transistor PG-2 connected between the bit line BLB and the output 404 of the second inverter. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 400 will maintain the complementary values at storage nodes SN and SNB indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

During a WRITE operation, bit lines BL and BLB are set to opposite logic values according to the new data that will be written into the SRAM cell 400. For example, in an SRAM write operation, a logic state "1" stored in a data latch of the SRAM cell 400 can be reset by setting BL to "0" and BLB to "1". In response to a binary code from a row decoder (not shown), a word line coupled to the pass-gate transistors PG-1 and PG-2 of the SRAM cell 400 is asserted to select the memory cell and turn on PG-1 and PG-2. As a result, the storage nodes SN and SNB are connected to BL and BLB respectively. Furthermore, the storage node SN of the data latch is discharged by BL to "0" and the other storage node of the data latch is charged by BLB to "1". As a result, the new data logic "0" is latched into the SRAM cell 400.

In a READ operation, BL and BLB of the SRAM cell 400 are pre-charged to a voltage approximately equal to the operating voltage of the memory bank in which the SRAM cell 400 is located. In response to a binary code from the row decoder, a word line coupled to the first pass-gate PG-1 and the second pass-gate PG-2 of the SRAM cell 400 is asserted so that the data latch is selected to proceed to a READ operation.

During a READ operation, through a turned on pass-gate transistors PG-1 and PG-2, one bit line coupled to the storage node storing a logic "0" is discharged to a lower voltage. Meanwhile, the other bit line remains the precharged voltage because there is no discharging path between the other bit line and the storage node storing a logic "1". The differential voltage between BL and BLB (approximately in a range from 50 to 100 mV) is detected by a sense amplifier (not shown). Furthermore, the sense amplifier amplifies the differential voltage and reports the logic state of the memory cell via a data buffer.

In the circuit diagram of FIG. 19, transistors PU-1, PU-2 are p-type transistors. Transistors PD-1, PD-2, PG-1, and PG-2 are n-type transistors. According to various embodiments, transistors PU-1, PU-2, PD-1, PD-2, PG-1 and PG-2 are implemented by FinFETs that may be fabricated using the process as illustrated in FIGS. 1-18. Specifically, as shown in FIG. 20, which depicts a layout of the SRAM cell 400 in accordance with some embodiments of the present disclosure. The transistors are labeled as for FIG. 19, for example, PG-1, PU-2 etc. Fins are numbered Fin1, Fin2, Fin3, and Fin4 and are each a semiconductor fin. Fin1 and Fin4 are formed over P well regions PW to provide the semiconductor regions for the n-type transistors PD-1, PD-2, PG-1, and PG-2. Fins 2 and 3 are formed over an N well region NW to provide the semiconductor region for the p-type transistors PU-1, PU-2. The N well region NW also provides a contact for the body or bulk terminal of the p-type transistors and in embodiments of the SRAM cells, may be coupled to different positive voltages to further enhance performance. The metal gate is shown for each transistor and where the metal gate overlies a fin, a transistor is formed.

CPO features are arranged to define ends of metal gates. For example, a CPO feature 410 is disposed at an end of the metal gate of the transistor PD-2, a CPO feature 420 is disposed between ends of the metal gates of the transistors PG-2 and PU-1, a CPO feature 430 is disposed between ends of the metal gates of the transistors PU-2 and PG1, and a CPO feature 440 is disposed at an end of the metal gate of the transistor PD-1.

In some embodiments, the CPO features in the P well regions PW are contracted using processes as illustrated in FIGS. 15 and 16, and hence the contracted CPO features can induce tensile strain to channels of n-type transistors in the P well regions PW and/or improve the gate-filling window for the metal gates of the n-type transistors. For examples, the CPO feature 410 is a contracted structure so that the n-type transistor PG-2 and/or the n-type transistor PD-2 may have the tensile strained channel and/or improved gate-filling window. Similarly, the CPO feature 440 is also a contracted structure so that the n-type transistor PG-1 and/or the n-type transistor PD-1 may have the tensile strained channel and/or improved gate-filling window. In some embodiments, the CPO features in the N well region NW, e.g. the CPO features 420 and 430, are contracted as well. In alternative embodiments, the CPO features in the N well region NW are not contracted so as to prevent tensile strained channels from forming in the p-type transistors.

Embodiments of the present disclosure may have at least following advantages. The CPO feature is contracted before replacing the dummy gate structure, and the contraction of the CPO feature bends the gate spacer toward the CPO feature, and hence the replacement gate process window can be enlarged. Moreover, the contraction of the CPO feature can induce tensile strain to the neighboring channel, so that a tensile strained channel can be formed.

According to some embodiments of the present disclosure, a semiconductor device includes a semiconductor fin, a gate cut region, a first gate structure and a second gate structure. The semiconductor fin extends from a substrate. The gate cut region extends in parallel with a longitudinal axis of the semiconductor fin and not overlaps the semiconductor fin. The first gate structure and the second gate structure extend across the semiconductor fin. The first gate structure is laterally between the gate cut region and the second gate structure along a direction parallel with the longitudinal axis of the semiconductor fin. The first gate structure has a greater width variation than the second gate structure.

According to some embodiments of the present disclosure, a semiconductor device includes first and second semiconductor channel regions, first, second and third gate structures, and a gate cut region. The first semiconductor channel region and the second semiconductor channel region are over a substrate. The first gate structure and the second gate structure are respectively over the first semiconductor channel region and the second semiconductor channel region. The gate cut region is between a longitudinal end of the first gate structure and a longitudinal end of the second gate structure. The third gate structure extends past opposite sides of the gate cut region. When viewed in a cross section taken along a direction perpendicular to a longitudinal axis of the third gate structure, a lateral dimension of the third gate structure expands as the third gate structure extends away from the substrate.

According to some embodiments of the present disclosure, a semiconductor device includes a first pass-gate transistor, a first pull-up transistor, and a first gate cut feature. The first pass-gate transistor is within a first P-well region in a substrate. The first pull-up transistor is within an N-well region abutting the first P-well region. The first pull-up transistor has a gate aligned with a gate of the first pass-gate transistor. The first gate cut feature is between a longitudinal end of the gate of the first pull-up transistor and a longitudinal end of the gate of the first pass-gate transistor. A lateral dimension of the first gate cut feature narrows as the first gate cut feature extends away from the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor fin extending from a substrate;
    a gate cut region extending in parallel with a longitudinal axis of the semiconductor fin and not overlapping the semiconductor fin; and
    a first gate structure and a second gate structure extending across the semiconductor fin, the first gate structure being laterally between the gate cut region and the second gate structure along a direction parallel with the longitudinal axis of the semiconductor fin, the first gate structure having a greater width variation than the second gate structure.

2. The semiconductor device of claim 1, wherein the first gate structure has a maximal width greater than a maximal width of the second gate structure.

3. The semiconductor device of claim 1, wherein the first gate structure has a width increasing as a distance from the substrate increases.

4. The semiconductor device of claim 1, further comprising:
an interlayer dielectric (ILD) layer between the first gate structure and the second gate structure, wherein the gate cut region has a greater width variation than the ILD layer.

5. The semiconductor device of claim 1, wherein the gate cut region has a width decreasing as a distance from the substrate increases.

6. The semiconductor device of claim 1, wherein the gate cut region includes a dielectric filling and a dielectric liner lining a bottom surface and sidewalls of the dielectric filling.

7. The semiconductor device of claim 6, wherein the dielectric liner is silicon nitride.

8. The semiconductor device of claim 6, wherein the dielectric filling is oxide.

9. The semiconductor device of claim 6, wherein the dielectric filling and the dielectric liner form a bottom interface and a sidewall interface extending at an angle from the bottom interface.

10. The semiconductor device of claim 6, wherein the dielectric liner has a smaller thickness than the dielectric filling.

11. The semiconductor device of claim 6, wherein the dielectric liner has a thickness in a range from 20 angstroms to 60 angstroms.

12. The semiconductor device of claim 6, wherein the dielectric filling has a thickness in a range from 200 angstroms to 300 angstroms.

13. A semiconductor device, comprising:
a first semiconductor channel region and a second semiconductor channel region over a substrate;
a first gate structure and a second gate structure respectively over the first semiconductor channel region and the second semiconductor channel region;
a gate cut region between a longitudinal end of the first gate structure and a longitudinal end of the second gate structure; and
a third gate structure extending past opposite sides of the gate cut region, wherein when viewed in a cross section taken along a direction perpendicular to a longitudinal axis of the third gate structure, a lateral dimension of the third gate structure expands as the third gate structure extends away from the substrate.

14. The semiconductor device of claim 13, wherein when viewed in the cross section taken along the direction perpendicular to the longitudinal axis of the third gate structure, a lateral dimension of the gate cut region narrows as the gate cut region extends away from the substrate.

15. The semiconductor device of claim 13, wherein the gate cut region includes an oxide structure and a nitride liner lining a bottom surface and sidewalls of the oxide structure.

16. The semiconductor device of claim 13, further comprising a fourth gate structure located at one side of the third gate structure facing away from the gate cut region, wherein when view in the cross section taken along the direction perpendicular to the longitudinal axis of the third gate structure, the fourth gate structure has a maximal lateral dimension smaller than a maximal lateral dimension of the third gate structure.

17. A semiconductor device, comprising:
a first pass-gate transistor within a first P-well region in a substrate;
a first pull-up transistor within an N-well region abutting the first P-well region, the first pull-up transistor having a gate aligned with a gate of the first pass-gate transistor; and
a first gate cut feature between a longitudinal end of the gate of the first pull-up transistor and a longitudinal end of the gate of the first pass-gate transistor, wherein a lateral dimension of the first gate cut feature narrows as the first gate cut feature extends away from the substrate.

18. The semiconductor device of claim 17, wherein the first gate cut feature comprises an oxide structure and a nitride liner lining a bottom surface and sidewalls of the oxide structure, and the oxide structure has a lateral dimension narrowing as the oxide structure extends away from the substrate.

19. The semiconductor device of claim 17, further comprising:
a second pull-up transistor within the N-well region;
a second pass-gate transistor within a second P-well region abutting the N-well region, the second pass-gate transistor having a gate aligned with a gate of the second pull-up transistor; and
a second gate cut feature between a longitudinal end of the gate of the second pass-gate transistor and a longitudinal end of the gate of the second pull-up transistor, wherein a lateral dimension of the second gate cut feature narrows as the second gate cut feature extends away from the substrate.

20. The semiconductor device of claim 19, further comprising:
a pull-down transistor within the first P-well region, the pull-down transistor having a gate continuously extending from the gate of the second pull-up transistor; and
a third gate cut feature on a longitudinal end of the gate of the pull-down transistor away from the gate of the second pull-up transistor, wherein a lateral dimension of the third gate cut feature narrows as the third gate cut feature extends away from the substrate.

* * * * *